(12) United States Patent
Sullivan et al.

(10) Patent No.: US 7,007,105 B1
(45) Date of Patent: Feb. 28, 2006

(54) METHOD AND SYSTEM FOR IMPROVING DATA TRANSMISSION AND STORAGE OF MARKUP LANGUAGE DOCUMENTS

(75) Inventors: Mark K. Sullivan, Joplin, MO (US); Charles Adam Crowder, Carthage, MO (US)

(73) Assignee: Remote Knowledge, Inc., Houston, TX (US)

( * ) Notice: Subject to any disclaimer, the term of this patent is extended or adjusted under 35 U.S.C. 154(b) by 833 days.

(21) Appl. No.: 09/758,581

(22) Filed: Jan. 11, 2001

(51) Int. Cl.
*G06F 13/00* (2006.01)

(52) U.S. Cl. .................. 709/247; 709/219; 715/513

(58) Field of Classification Search .............. 709/203, 709/217, 219, 247; 719/328, 329; 715/513
See application file for complete search history.

(56) References Cited

U.S. PATENT DOCUMENTS

| | | | | |
|---|---|---|---|---|
| 5,953,503 A | * | 9/1999 | Mitzenmacher et al. | 709/203 |
| 5,991,713 A | * | 11/1999 | Unger et al. | 704/9 |
| 5,999,949 A | * | 12/1999 | Crandall | 715/532 |
| 6,247,018 B1 | * | 6/2001 | Rheaume | 707/102 |
| 6,311,223 B1 | * | 10/2001 | Bodin et al. | 709/247 |
| 6,349,202 B1 | * | 2/2002 | Odamura | 455/412.1 |
| 6,434,561 B1 | * | 8/2002 | Durst et al. | 707/10 |
| 6,658,463 B1 | * | 12/2003 | Dillon et al. | 709/219 |
| 6,728,785 B1 | * | 4/2004 | Jungck | 709/247 |

FOREIGN PATENT DOCUMENTS

EP 928070 A2 * 7/1999

* cited by examiner

*Primary Examiner*—Viet D. Vu
(74) *Attorney, Agent, or Firm*—Shook, Hardy & Bacon L.L.P.

(57) ABSTRACT

A method and system are provided for improving the transmission and storage of documents utilizing markup languages. The system converts the markup language tags to tokens and combines the tokens with the content information to create a token stream. The token stream is further compressed and stored on a device or transmitted over a communications network. The compressed token stream may then be decompressed and de-tokenized to return the markup language document to its original content form. The method may be performed on a computing device or over the transmission network.

41 Claims, 2 Drawing Sheets

METHOD AND SYSTEM FOR IMPROVING DATA TRANSMISSION AND STORAGE OF MARKUP LANGUAGE DOCUMENTS

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present invention relates generally to a method for compressing data in a computer system, and more particularly, to such a method and system that improves the transmission and storage of documents that utilize markup languages.

BACKGROUND OF THE INVENTION

Markup languages provide formatting information necessary for Web browsers to display documents found on the World Wide Web within the Internet. Commonly used markup languages include Hypertext Markup Language (HTML) and Extensible Markup Language (XML). A document formatted or written in a markup language contains two types of information—formatting information and content information. "Markup" refers to sets of commands or tags that describe to the web browser how to format and layout content information on a page. The content data consists of readable information characters typically encoded according to the American Standard for Information Interchange (ASCII) that is actually displayed to a user. The markup commands or "tags" typically consist of multiple ASCII characters that describe the format for the content information to be displayed. For example, a tag for creating a table in a document would start with an opening tag <TABLE> followed by the content information for the table and then closed by an end tag </TABLE>.

As markup language documents are transmitted and stored on the World Wide Web, their binary representations may be compressed to facilitate efficient transmission of the data. Conventional compression techniques reduce the size of the binary markup language document representation that reduces the time required to transmit and the space required to store the document. Each character within a markup language document is weighed equally when converted to its binary representation. Many markup tags, however, contain multiple characters to describe a particular format type. For example, using the tag (FONT FACE="ARIAL" SIZE=2 COLOR="#339966") describes the font, its size and color for text to be displayed to the user. Each character within that markup tag would be translated to a binary representation that would be further compressed using conventional compression algorithms. However, using multiple characters to establish a particular format takes up more storage and requires a larger bandwidth to transmit such a document. Furthermore, many markup tags are necessary to properly display a document resulting in an increased amount of storage necessary to store such a document and to transmit the document.

Markup language tags having multiple characters to represent certain formats are said to exhibit a high degree of redundancy or a low information entropy. This leads to data representing character formats having the same "value" as the character information itself. This result produces a document with many formatting characters associated with a fewer number of information characters. Currently, there is no meaningful method for describing the markup language tags in proper proportion to the content data. For example, to show a bold character you would need the opening tag <B> the character data, and the closing tag </B>. Thus, describing character data in a bold format would require seven characters to do so.

Low bandwidth applications or transmission systems sending large amounts of information require efficient compression of information to the maximum extent possible. Current compression techniques suitable for applications that do not have bandwidth limitations may continue to be acceptable solutions for that environment. However, narrow bandwidth applications require additional methods and techniques to optimize compression of data and its associated formatting information to achieve efficient transmission. One such narrow bandwidth application is transmitting information via satellite where bandwidth space is limited.

Current compression techniques are also adequate to serve hardware configurations having large amounts of memory to store markup language documents. However, as more devices are introduced to receive markup language files and display such information to a user, space may become limited in such devices. These devices may include hand-held personal data assistants (PDAs) or a cellular telephones.

Accordingly, there exists a need to optimize the storage and transmission of documents formatted in markup languages. Moreover, there is a need for such a method that is more efficient, more economical and faster than conventional methods for compressing data in a markup language format.

SUMMARY OF THE INVENTION

Generally described, a method in a computer system for improving data transmission of markup language documents that includes markup tags and information characters is provided. In accordance with the method, markup tags in the document are converted to tokens and a token stream is created. The token stream is then compressed using a compression algorithm. Then, the token stream is decompressed using the compression algorithm and the markup tags are recreated from the token stream.

In another aspect of the present invention, a method in a computer system is provided for improving data transmission of markup language documents. The method includes converting markup tags to tokens and creating a token stream.

A method and system are provided for improving the transmission and storage of documents utilizing markup languages. The system converts the markup language tags to tokens and combines the tokens with the content information to create a token stream. The token stream is further compressed and stored on a device or transmitted over a communications network. The compressed token stream may then be decompressed and de-tokenized to return the markup language document to its original content form. The method may be performed on a computing device or over the transmission network.

BRIEF DESCRIPTION OF THE DRAWINGS

The objectives and advantages of the present invention will become readily apparent to those skilled in the art from the following detailed description of the drawings, in which.

DETAILED DESCRIPTION OF THE INVENTION

Figure 1:
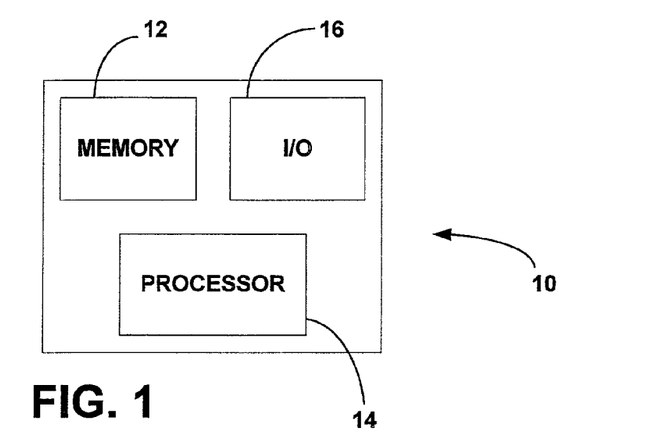
FIG. 1 is a block diagram illustrating a computing environment for implementing the present invention.

The present invention provides a method and system for improving the transmission and storage of documents utilizing markup languages. FIG. 1 is a block diagram illustrating a typical computing device 10 in which invention may be implemented. The computing device 10 is an example of a suitable computing environment and is not intended to suggest any limitation as to the scope of use or functionality of the present invention. The present invention is operational with numerous general purpose or special purpose computer systems. Examples of well known computing systems that are suitable for use with the present invention include, but are not limited to, personal computers, server computers, hand-held or laptop devices, multi-processor systems, microprocessor-based systems, programable consumer electronics, network PCs, mini computers, mainframe computers, distributed computing environments that include any of the above systems or devices, and the like.

The invention may be described in the general context of computer-executable instructions such as program modules, being executed by a computer. Generally, program modules include routines, programs, objects, components and data structures, that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Referring back to FIG. 1, computing device 10 typically includes memory 12, processor 14, and input/output interface 16. Input/output interface 16 may include a number of input devices such as a keyboard, mouse, pen, voice input devices or touch input devices. The input/output interface 16 may also include various output devices including a display, speakers, or a printer. The input/output interface 16 also includes communications connections that allow the computing device to communicate with other devices. The communication connections may include numerous communication media. Communication media may include, but are not limited to, wired media such as a wire network or direct wire connection, and wireless media such as acoustic, RF, infrared and other wireless media.

Figure 2:
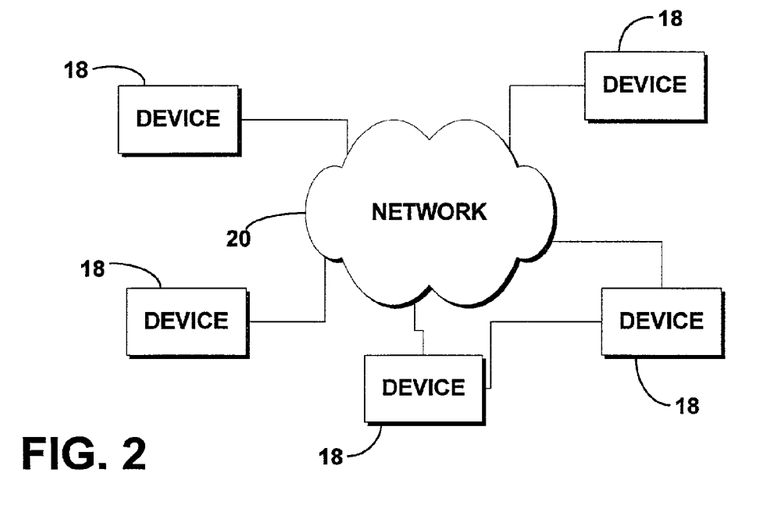
FIG. 2 is a block diagram illustrating a network environment for implementing the present invention.
Figure 3:
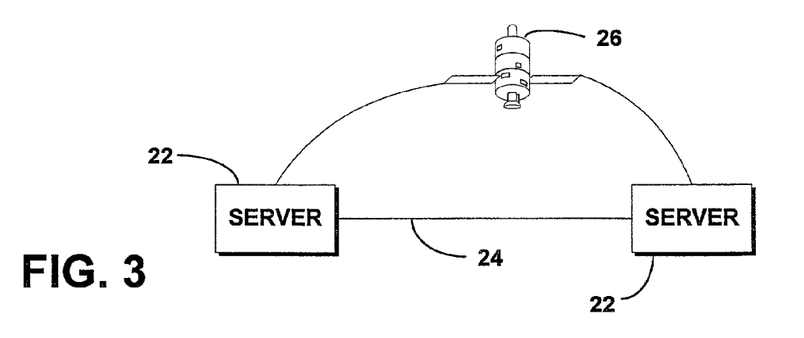
FIG. 3 is a block diagram further illustrating network environment in FIG. 2 for practicing the present invention.

As described in greater detail below, the present invention may be implemented in a single computing device or across multiple computing devices through a computer network. As shown in FIG. 2, a block diagram illustrates multiple devices 18 in communication with one another either through a network 20 or through a direct communication link between the devices 18. The devices 18 may be personal computers, servers, routers, network PCs, peer devices, or common network nodes, and they typically include many or all of the elements described above relative to the computing device 10 in FIG. 1. The present invention may be performed using a preferred method that is described in greater detail below using one device or across multiple devices within a network. FIG. 3 is a block diagram illustrating a preferred network embodiment for practicing the method of the present invention. As devices 18 (FIG. 2) are coupled with a network 20, the network 20 may include servers 22 that are in communication with one another. The communication may be implemented through a series of wired connections 24 or may be a wireless type connection through a satellite network 26. As would be understood, devices 18 (FIG. 2) may also be in direct communication with the satellite network 26 to facilitate direct communication between two or more devices 18. Alternatively, devices 18 may be in communication directly with a satellite network 26 to communicate with a server 22 that in turn communicates with another device 18. Combinations of the above are all included within the scope of the present invention.

Figure 4:
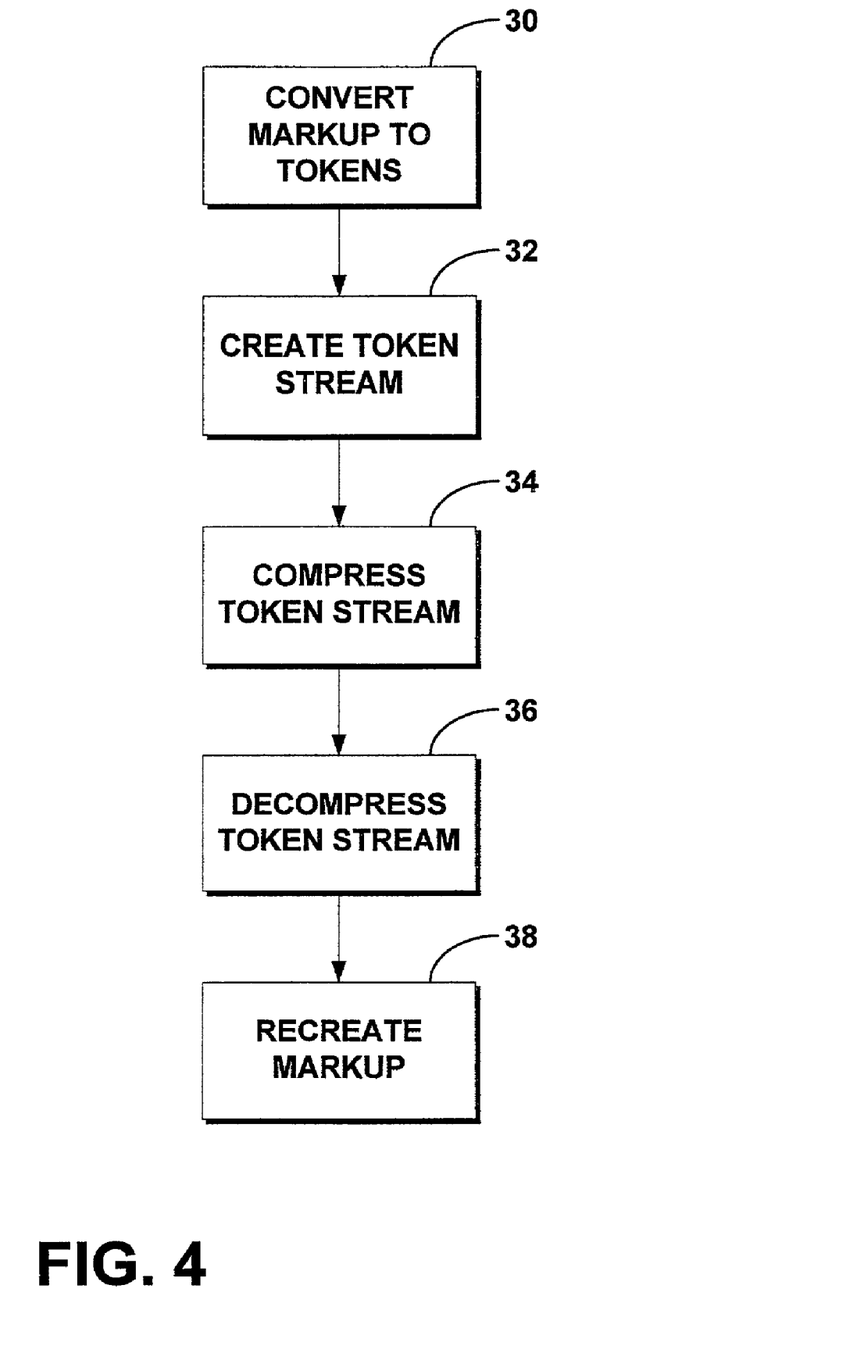
FIG. 4 is a flow diagram illustrating a preferred method for improving data transmission and storage of markup language documents in accordance with the present invention.

FIG. 4 is a flow diagram illustrating a preferred method for improving data transmission and storage of markup language documents. At step 30, the system converts the tags within the markup language document to tokens. As mentioned above, two types of information are typically included in markup language documents. First, content information that includes the readable information characters that the user sees and secondly, the markup instructions or tags that tell the displaying program how to visually represent the content information characters. The content information characters within the document may be considered to already each be a single token. Converting the tags to tokens is accomplished by parsing the document, according to well known techniques, to recognize the markup language tags. A lookup table is then utilized by the system to match the markup language tags to an appropriate token.

At step 32, the system creates a token stream from the converted markup tags and the non-tag characters. The token stream is placed into another document. At step 34, the token stream is compressed by encoding the sequence of tokens into transmittable symbols. Each symbol is a unique sequence of binary bits. The symbol sequences are not all the same size and are carefully chosen so that those symbols that appear most frequently are encoded with the fewest bits. Furthermore, the bit streams are such that no concatenation of valid strings can be confused with some other string and that no initial substring of a valid string is equal to a shorter valid string. A variety of well known compression algorithms may be employed to compress the token stream. Huffman coding is a preferred compression technique. A slight improvement may be realized by using a similar technique, arithmetic coding, to compress the token stream. Additional compression encoding methods include substitution codes such as LZ77, LZ78, and LZW.

At this point, the compressed string of binary information is ready for transmission. Systems receiving this binary representation decompress the binary stream and recreate the markup language document at the receiving system.

At step 36, the token stream is decompressed at the receiving system by performing the same encoding algorithm used in the compression at step 34. At step 38, the markup tags are recreated utilizing the same table used to create the original token stream resulting in a markup language document having tags and content character information. Markup languages are not case sensitive and are not sensitive to placement of spaces within the tags. As such, the case and precise spacing of information within the tag is discarded when creating the token stream at step 32. This may result in a reproduced document, at step 38, that differs in these attributes from the original document. However, the reproduced document has the exact same semantic meaning and produces the same display representation for the user.

In another embodiment, the markup recreation at step 38 may not be needed. As a first step in creating or converting the markup tags to tokens, the document must be parsed to recognize the tag information and create a document containing the resulting tokens. A markup language viewing or printing program may be programmed to recognize the token stream instead of the markup language tags. In other words, the displaying of the content information is driven by the token stream and not the markup tags. However, most viewing and printing programs must have the capability of displaying documents using markup tags and thus will have to retain the ability to parse the token stream to recreate the markup tags.

As mentioned above, a table is utilized to assign the markup language tags to tokens. This token look-up table assigns token values to each sequence of characters representing a tag. For example, HTML tags include a start tag, an end tag, and HTML attributes that are each assigned to a particular token. Further, this token look-up table is extensible to include XML tags and their corresponding attributes created by users. Additionally, the extensible nature of this table allows for future expansion of new HTML tags and other unforeseen markup language tags and attributes. That is, the extensible nature of the token look-up table allows users to expand the table. A preferred embodiment does this by reserving a number of token codes for definition by the tag to token converter. Table A provided below illustrates a preferred token look-up table. The table assigns content characters, tag, and attribute names to token values. No particular sequence of assignments is optimal, and thus, the table is completely arbitrary and one assignment is as good as any.

Table B provided below illustrates a token compression table utilized by the compression algorithm created by the compression algorithm as described above at step 34. This table takes the token stream and creates an appropriate Huffman code. The assignment of the variable length bit strings to token values is critical to the performance of a preferred method. The assignments in the compression table are chosen based upon the statistical frequencies of the various tokens encountered in an actual sample of HTML and XML coded documents.

In operation, a user creates a HTML or XML document that is placed on the internet or the World Wide Web. The document is made available on the web and the markup language tags within the document are converted to tokens utilizing the algorithm stated above. The converted tags are combined with the character information to create a token stream. This token stream is further compressed using a of substitution code, preferably Huffman coding. The document is now compressed to the point where limited bandwidth applications may be able to transmit and receive the document. One such example of a narrow bandwidth application is transmitting documents via a satellite network. Users receiving the document then decompress the document using the same Huffman code. Then, the markup tags are recreated using the same algorithm to create the tokens. The document is now ready for display at the receiving units or receiving device location.

The present invention provides a number of advantages. Tokenizing the HTML code extracted from the World Wide Web has measured a 25% compression improvement over standard compression methods alone. When tested with a sample of 500 HTML and XML files extracted from the World Wide Web, the tokenizing process on average, converted each 1000 characters of HTML source code to 832 tokens. Thus, the tokenizing step alone can compress the size of the document's binary representation. Further converting the markup language tags to tokens gives the tag information the same semantic weight as the character content information. Thus, the same document can be compressed to a higher degree resulting in a smaller file and faster transmission.

Although the invention has been described with reference to a preferred embodiment as illustrated in the attached drawing figures, it is noted that substitutions may be made and equivalents employed herein without departing from the scope of the invention as recited in the claims.

TABLE A

| Token (hexadecimal) | Symbol |
|---|---|
| 0x000 | Content Code 0x00 |
| 0x001 | Content Code 0x01 |
| 0x002 | Content Code 0x02 |
| 0x003 | Content Code 0x03 |
| 0x004 | Content Code 0x04 |
| 0x005 | Content Code 0x05 |
| 0x006 | Content Code 0x06 |
| 0x007 | Content Code 0x07 |
| 0x008 | Content Code 0x08 |
| 0x009 | Content Code 0x09 |
| 0x00A | Content Code 0x0A |
| 0x00B | Content Code 0x0B |
| 0x00C | Content Code 0x0C |
| 0x00D | Content Code 0x0D |
| 0x00E | Content Code 0x0E |
| 0x00F | Content Code 0x0F |
| 0x010 | Content Code 0x10 |
| 0x011 | Content Code 0x11 |
| 0x012 | Content Code 0x12 |
| 0x013 | Content Code 0x13 |
| 0x014 | Content Code 0x14 |
| 0x015 | Content Code 0x15 |
| 0x016 | Content Code 0x16 |
| 0x017 | Content Code 0x17 |
| 0x018 | Content Code 0x18 |
| 0x019 | Content Code 0x19 |
| 0x01A | Content Code 0x1A |
| 0x01B | Content Code 0x1B |
| 0x01C | Content Code 0x1C |
| 0x01D | Content Code 0x1D |
| 0x01E | Content Code 0x1E |
| 0x01F | Content Code 0x1F |
| 0x020 | Content Character " " |
| 0x021 | Content Character "!" |
| 0x022 | Content Character """ |
| 0x023 | Content Character "#" |
| 0x024 | Content Character "$" |
| 0x025 | Content Character "%" |
| 0x026 | Content Character "&" |
| 0x027 | Content Character "'" |
| 0x028 | Content Character "(" |
| 0x029 | Content Character ")" |
| 0x02A | Content Character "*" |
| 0x02B | Content Character "+" |
| 0x02C | Content Character "," |
| 0x02D | Content Character "-" |
| 0x02E | Content Character "." |
| 0x02F | Content Character "/" |
| 0x030 | Content Character "0" |

TABLE A-continued

| Token (hexadecimal) | Symbol |
|---|---|
| 0x031 | Content Character "1" |
| 0x032 | Content Character "2" |
| 0x033 | Content Character "3" |
| 0x034 | Content Character "4" |
| 0x035 | Content Character "5" |
| 0x036 | Content Character "6" |
| 0x037 | Content Character "7" |
| 0x038 | Content Character "8" |
| 0x039 | Content Character "9" |
| 0x03A | Content Character ":" |
| 0x03B | Content Character ";" |
| 0x03C | Content Character "<" |
| 0x03D | Content Character "=" |
| 0x03E | Content Character ">" |
| 0x03F | Content Character "?" |
| 0x040 | Content Character "@" |
| 0x041 | Content Character "A" |
| 0x042 | Content Character "B" |
| 0x043 | Content Character "C" |
| 0x044 | Content Character "D" |
| 0x045 | Content Character "E" |
| 0x046 | Content Character "F" |
| 0x047 | Content Character "G" |
| 0x048 | Content Character "H" |
| 0x049 | Content Character "I" |
| 0x04A | Content Character "J" |
| 0x04B | Content Character "K" |
| 0x04C | Content Character "L" |
| 0x04D | Content Character "M" |
| 0x04E | Content Character "N" |
| 0x04F | Content Character "O" |
| 0x050 | Content Character "P" |
| 0x051 | Content Character "Q" |
| 0x052 | Content Character "R" |
| 0x053 | Content Character "S" |
| 0x054 | Content Character "T" |
| 0x055 | Content Character "U" |
| 0x056 | Content Character "V" |
| 0x057 | Content Character "W" |
| 0x058 | Content Character "X" |
| 0x059 | Content Character "Y" |
| 0x05A | Content Character "Z" |
| 0x05B | Content Character "[" |
| 0x05C | Content Character "\" |
| 0x05D | Content Character "]" |
| 0x05E | Content Character "^" |
| 0x05F | Content Character "_" |
| 0x060 | Content Character "`" |
| 0x061 | Content Character "a" |
| 0x062 | Content Character "b" |
| 0x063 | Content Character "c" |
| 0x064 | Content Character "d" |
| 0x065 | Content Character "e" |
| 0x066 | Content Character "f" |
| 0x067 | Content Character "g" |
| 0x068 | Content Character "h" |
| 0x069 | Content Character "i" |
| 0x06A | Content Character "j" |
| 0x06B | Content Character "k" |
| 0x06C | Content Character "l" |
| 0x06D | Content Character "m" |
| 0x06E | Content Character "n" |
| 0x06F | Content Character "o" |
| 0x070 | Content Character "p" |
| 0x071 | Content Character "q" |
| 0x072 | Content Character "r" |
| 0x073 | Content Character "s" |
| 0x074 | Content Character "t" |
| 0x075 | Content Character "u" |
| 0x076 | Content Character "v" |
| 0x077 | Content Character "w" |
| 0x078 | Content Character "x" |
| 0x079 | Content Character "y" |
| 0x07A | Content Character "z" |
| 0x07B | Content Character "{" |
| 0x07C | Content Character "|" |
| 0x07D | Content Character "}" |
| 0x07E | Content Character "~" |
| 0x07F | Content Code 0x7F |
| 0x080 | Content Code 0x80 |
| 0x081 | Content Code 0x81 |
| 0x082 | Content Code 0x82 |
| 0x083 | Content Code 0x83 |
| 0x084 | Content Code 0x84 |
| 0x085 | Content Code 0x85 |
| 0x086 | Content Code 0x86 |
| 0x087 | Content Code 0x87 |
| 0x088 | Content Code 0x88 |
| 0x089 | Content Code 0x89 |
| 0x08A | Content Code 0x8A |
| 0x08B | Content Code 0x8B |
| 0x08C | Content Code 0x8C |
| 0x08D | Content Code 0x8D |
| 0x08E | Content Code 0x8E |
| 0x08F | Content Code 0x8F |
| 0x090 | Content Code 0x90 |
| 0x091 | Content Code 0x91 |
| 0x092 | Content Code 0x92 |
| 0x093 | Content Code 0x93 |
| 0x094 | Content Code 0x94 |
| 0x095 | Content Code 0x95 |
| 0x096 | Content Code 0x96 |
| 0x097 | Content Code 0x97 |
| 0x098 | Content Code 0x98 |
| 0x099 | Content Code 0x99 |
| 0x09A | Content Code 0x9A |
| 0x09B | Content Code 0x9B |
| 0x09C | Content Code 0x9C |
| 0x09D | Content Code 0x9D |
| 0x09E | Content Code 0x9E |
| 0x09F | Content Code 0x9F |
| 0x0A0 | Content Code 0xA0 |
| 0x0A1 | Content Code 0xA1 |
| 0x0A2 | Content Code 0xA2 |
| 0x0A3 | Content Code 0xA3 |
| 0x0A4 | Content Code 0xA4 |
| 0x0A5 | Content Code 0xA5 |
| 0x0A6 | Content Code 0xA6 |
| 0x0A7 | Content Code 0xA7 |
| 0x0A8 | Content Code 0xA8 |
| 0x0A9 | Content Code 0xA9 |
| 0x0AA | Content Code 0xAA |
| 0x0AB | Content Code 0xAB |
| 0x0AC | Content Code 0xAC |
| 0x0AD | Content Code 0xAD |
| 0x0AE | Content Code 0xAE |
| 0x0AF | Content Code 0xAF |
| 0x0B0 | Content Code 0xB0 |
| 0x0B1 | Content Code 0xB1 |
| 0x0B2 | Content Code 0xB2 |
| 0x0B3 | Content Code 0xB3 |
| 0x0B4 | Content Code 0xB4 |
| 0x0B5 | Content Code 0xB5 |
| 0x0B6 | Content Code 0xB6 |
| 0x0B7 | Content Code 0xB7 |
| 0x0B8 | Content Code 0xB8 |
| 0x0B9 | Content Code 0xB9 |
| 0x0BA | Content Code 0xBA |
| 0x0BB | Content Code 0xBB |
| 0x0BC | Content Code 0xBC |
| 0x0BD | Content Code 0xBD |
| 0x0BE | Content Code 0xBE |
| 0x0BF | Content Code 0xBF |
| 0x0C0 | Content Code 0xC0 |
| 0x0C1 | Content Code 0xC1 |
| 0x0C2 | Content Code 0xC2 |
| 0x0C3 | Content Code 0xC3 |
| 0x0C4 | Content Code 0xC4 |
| 0x0C5 | Content Code 0xC5 |
| 0x0C6 | Content Code 0xC6 |
| 0x0C7 | Content Code 0xC7 |
| 0x0C8 | Content Code 0xC8 |
| 0x0C9 | Content Code 0xC9 |
| 0x0CA | Content Code 0xCA |

TABLE A-continued

| Token (hexadecimal) | Symbol |
|---|---|
| 0x0CB | Content Code 0xCB |
| 0x0CC | Content Code 0xCC |
| 0x0CD | Content Code 0xCD |
| 0x0CE | Content Code 0xCE |
| 0x0CF | Content Code 0xCF |
| 0x0D0 | Content Code 0xD0 |
| 0x0D1 | Content Code 0xD1 |
| 0x0D2 | Content Code 0xD2 |
| 0x0D3 | Content Code 0xD3 |
| 0x0D4 | Content Code 0xD4 |
| 0x0D5 | Content Code 0xD5 |
| 0x0D6 | Content Code 0xD6 |
| 0x0D7 | Content Code 0xD7 |
| 0x0D8 | Content Code 0xD8 |
| 0x0D9 | Content Code 0xD9 |
| 0x0DA | Content Code 0xDA |
| 0x0DB | Content Code 0xDB |
| 0x0DC | Content Code 0xDC |
| 0x0DD | Content Code 0xDD |
| 0x0DE | Content Code 0xDE |
| 0x0DF | Content Code 0xDF |
| 0x0E0 | Content Code 0xE0 |
| 0x0E1 | Content Code 0xE1 |
| 0x0E2 | Content Code 0xE2 |
| 0x0E3 | Content Code 0xE3 |
| 0x0E4 | Content Code 0xE4 |
| 0x0E5 | Content Code 0xE5 |
| 0x0E6 | Content Code 0xE6 |
| 0x0E7 | Content Code 0xE7 |
| 0x0E8 | Content Code 0xE8 |
| 0x0E9 | Content Code 0xE9 |
| 0x0EA | Content Code 0xEA |
| 0x0EB | Content Code 0xEB |
| 0x0EC | Content Code 0xEC |
| 0x0ED | Content Code 0xED |
| 0x0EE | Content Code 0xEE |
| 0x0EF | Content Code 0xEF |
| 0x0F0 | Content Code 0xF0 |
| 0x0F1 | Content Code 0xF1 |
| 0x0F2 | Content Code 0xF2 |
| 0x0F3 | Content Code 0xF3 |
| 0x0F4 | Content Code 0xF4 |
| 0x0F5 | Content Code 0xF5 |
| 0x0F6 | Content Code 0xF6 |
| 0x0F7 | Content Code 0xF7 |
| 0x0F8 | Content Code 0xF8 |
| 0x0F9 | Content Code 0xF9 |
| 0x0FA | Content Code 0xFA |
| 0x0FB | Content Code 0xFB |
| 0x0FC | Content Code 0xEC |
| 0x0ED | Content Code 0xED |
| 0x0FE | Content Code 0xFE |
| 0x0FF | Content Code 0xFF |
| 0x100 | HTML Tag "<A" |
| 0x101 | HTML Tag "<ABBR" |
| 0x102 | HTML Tag "<ACRONYM" |
| 0x103 | HTML Tag "<ADDRESS" |
| 0x104 | HTML Tag "<APPLET" |
| 0x105 | HTML Tag "<AREA" |
| 0x106 | HTML Tag "<B" |
| 0x107 | HTML Tag "<BASE" |
| 0x108 | HTML Tag "<BASEFONT" |
| 0x109 | HTML Tag "<BDO" |
| 0x10A | HTML Tag "<BIG" |
| 0x10B | HTML Tag "<BLOCKQUOTE" |
| 0x10C | HTML Tag "<BODY" |
| 0x10D | HTML Tag "<BR" |
| 0x10E | HTML Tag "<BUTTON" |
| 0x10F | HTML Tag "<CAPTION" |
| 0x110 | HTML Tag "<CENTER" |
| 0x111 | HTML Tag "<CITE" |
| 0x112 | HTML Tag "<CODE" |
| 0x113 | HTML Tag "<COL" |
| 0x114 | HTML Tag "<COLGROUP" |
| 0x115 | HTML Tag "<DD" |
| 0x116 | HTML Tag "<DEL" |
| 0x117 | HTML Tag "<DFN" |
| 0x118 | HTML Tag "<DIR" |
| 0x119 | HTML Tag "<DIV" |
| 0x11A | HTML Tag "<DL" |
| 0x11B | HTML Tag "<DT" |
| 0x11C | HTML Tag "<EM" |
| 0x11D | HTML Tag "<FIELDSET" |
| 0x11E | HTML Tag "<FONT" |
| 0x11F | HTML Tag "<FORM" |
| 0x120 | HTML Tag "<FRAME" |
| 0x121 | HTML Tag "<FRAMESET" |
| 0x122 | HTML Tag "<H1" |
| 0x123 | HTML Tag "<H2" |
| 0x124 | HTML Tag "<H3" |
| 0x125 | HTML Tag "<H4" |
| 0x126 | HTML Tag "<H5" |
| 0x127 | HTML Tag "<H6" |
| 0x128 | HTML Tag "<HEAD" |
| 0x129 | HTML Tag "<HR" |
| 0x12A | HTML Tag "<HTML" |
| 0x12B | HTML Tag "<I" |
| 0x12C | HTML Tag "<IFRAME" |
| 0x12D | HTML Tag "<IMG" |
| 0x12E | HTML Tag "<INPUT" |
| 0x12F | HTML Tag "<INS" |
| 0x130 | HTML Tag "<ISINDEX" |
| 0x131 | HTML Tag "<KBD" |
| 0x132 | HTML Tag "<LABEL" |
| 0x133 | HTML Tag "<LEGEND" |
| 0x134 | HTML Tag "<LI" |
| 0x135 | HTML Tag "<LINK" |
| 0x136 | HTML Tag "<MAP" |
| 0x137 | HTML Tag "<MENU" |
| 0x138 | HTML Tag "<META" |
| 0x139 | HTML Tag "<NOFRAMES" |
| 0x13A | HTML Tag "<NOSCRIPT" |
| 0x13B | HTML Tag "<OBJECT" |
| 0x13C | HTML Tag "<OL" |
| 0x13D | HTML Tag "<OPTGROUP" |
| 0x13E | HTML Tag "<OPTION" |
| 0x13F | HTML Tag "<P" |
| 0x140 | HTML Tag "<PARAM" |
| 0x141 | HTML Tag "<PRE" |
| 0x142 | HTML Tag "<Q" |
| 0x143 | HTML Tag "<S" |
| 0x144 | HTML Tag "<SAMP" |
| 0x145 | HTML Tag "<SCRIPT" |
| 0x146 | HTML Tag "<SELECT" |
| 0x147 | HTML Tag "<SMALL" |
| 0x148 | HTML Tag "<SPAN" |
| 0x149 | HTML Tag "<STRIKE" |
| 0x14A | HTML Tag "<STRONG" |
| 0x14B | HTML Tag "<STYLE" |
| 0x14C | HTML Tag "<SUB" |
| 0x14D | HTML Tag "<SUP" |
| 0x14E | HTML Tag "<TABLE" |
| 0x14F | HTML Tag "<TBODY" |
| 0x150 | HTML Tag "<TD" |
| 0x151 | HTML Tag "<TEXTAREA" |
| 0x152 | HTML Tag "<TFOOT" |
| 0x153 | HTML Tag "<TH" |
| 0x154 | HTML Tag "<THEAD" |
| 0x155 | HTML Tag "<TITLE" |
| 0x156 | HTML Tag "<TR" |
| 0x157 | HTML Tag "<TT" |
| 0x158 | HTML Tag "<U" |
| 0x159 | HTML Tag "UL" |
| 0x15A | HTML Tag "<VAR" |
| 0x200 | HTML End Tag "</A>" |
| 0x201 | HTML End Tag "</ABBR>" |
| 0x202 | HTML End Tag "</ACRONYM>" |
| 0x203 | HTML End Tag "</ADDRESS>" |
| 0x204 | HTML End Tag "</APPLET>" |
| 0x205 | HTML End Tag "</AREA>" |
| 0x206 | HTML End Tag "</B>" |
| 0x207 | HTML End Tag "</BASE>" |
| 0x208 | HTML End Tag "</BASEFONT>" |
| 0x209 | HTML End Tag "</BDO>" |

TABLE A-continued

| Token (hexadecimal) | Symbol |
| --- | --- |
| 0x20A | HTML End Tag "</BIG>" |
| 0x20B | HTML End Tag "</BLOCKQUOTE>" |
| 0x20C | HTML End Tag "</BODY>" |
| 0x20D | HTML End Tag "</BR>" |
| 0x20E | HTML End Tag "</BUTTON>" |
| 0x20F | HTML End Tag "</CAPTION>" |
| 0x210 | HTML End Tag "</CENTER>" |
| 0x211 | HTML End Tag "</CITE>" |
| 0x212 | HTML End Tag "</CODE>" |
| 0x213 | HTML End Tag "</COL>" |
| 0x214 | HTML End Tag "</COLGROUP>" |
| 0x215 | HTML End Tag "</DD>" |
| 0x216 | HTML End Tag "</DEL>" |
| 0x217 | HTML End Tag "</DFN>" |
| 0x218 | HTML End Tag "</DIR>" |
| 0x219 | HTML End Tag "</DIV>" |
| 0x21A | HTML End Tag "</DL>" |
| 0x21B | HTML End Tag "</DT>" |
| 0x21C | HTML End Tag "</EM>" |
| 0x21D | HTML End Tag "</FIELDSET>" |
| 0x21E | HTML End Tag "</FONT>" |
| 0x21F | HTML End Tag "</FORM>" |
| 0x220 | HTML End Tag "</FRAME>" |
| 0x221 | HTML End Tag "</FRAMESET>" |
| 0x222 | HTML End Tag "</H1>" |
| 0x223 | HTML End Tag "</H2>" |
| 0x224 | HTML End Tag "</H3>" |
| 0x225 | HTML End Tag "</H4>" |
| 0x226 | HTML End Tag "</H5>" |
| 0x227 | HTML End Tag "</H6>" |
| 0x228 | HTML End Tag "</HEAD>" |
| 0x229 | HTML End Tag "</HR>" |
| 0x22A | HTML End Tag "</HTML>" |
| 0x22B | HTML End Tag "</I>" |
| 0x22C | HTML End Tag "</FRAME>" |
| 0x22D | HTML End Tag "</IMG>" |
| 0x22E | HTML End Tag "</INPUT>" |
| 0x22F | HTML End Tag "</INS>" |
| 0x230 | HTML End Tag "</ISINDEX>" |
| 0x231 | HTML End Tag "</KBD>" |
| 0x232 | HTML End Tag "</LABEL>" |
| 0x233 | HTML End Tag "</LEGEND>" |
| 0x234 | HTML End Tag "</LI>" |
| 0x235 | HTML End Tag "</LINK>" |
| 0x236 | HTML End Tag "</MAP>" |
| 0x237 | HTML End Tag "</MENU>" |
| 0x238 | HTML End Tag "</META>" |
| 0x239 | HTML End Tag "</NOFRAMES>" |
| 0x23A | HTML End Tag "</NOSCRIPT>" |
| 0x23B | HTML End Tag "</OBJECT>" |
| 0x23C | HTML End Tag "</OL>" |
| 0x23D | HTML End Tag "</OPTGROUP>" |
| 0x23E | HTML End Tag "</OPTION>" |
| 0x23F | HTML End Tao "</P>" |
| 0x240 | HTML End Tag "</PARAM>" |
| 0x241 | HTML End Tag "</PRE>" |
| 0x242 | HTML End Tag "</Q>" |
| 0x243 | HTML End Tag "</S>" |
| 0x244 | HTML End Tag "</SAMP>" |
| 0x245 | HTML End Tag "</SCRIPT>" |
| 0x246 | HTML End Tag "</SELECT>" |
| 0x247 | HTML End Tag "</SMALL>" |
| 0x248 | HTML End Tag "</SPAN>" |
| 0x249 | HTML End Tag "</STRIKE>" |
| 0x24A | HTML End Tag "</STRONG>" |
| 0x24B | HTML End Tag "</STYLE>" |
| 0x24C | HTML End Tag "</SUB>" |
| 0x24D | HTML End Tag "</SUP>" |
| 0x24E | HTML End Tag "</TABLE>" |
| 0x24F | HTML End Tag "</TBODY>" |
| 0x250 | HTML End Tag "</TD>" |
| 0x251 | HTML End Tag "</TEXTAREA>" |
| 0x252 | HTML End Tag "</TFOOT>" |
| 0x253 | HTML End Tag "</TH>" |
| 0x254 | HTML End Tag "</THEAD>" |
| 0x255 | HTML End Tag "</TITLE>" |
| 0x256 | HTML End Tag "</TR>" |
| 0x257 | HTML End Tag "</TT>" |
| 0x258 | HTML End Tag "</U>" |
| 0x259 | HTML End Tag "</UL>" |
| 0x25A | HTML End Tag "</VAR>" |
| 0x25B | HTML Tag closing ">" |
| 0x400 | HTML Attribute "ABBR" |
| 0x401 | HTML Attribute "ACCEPT-CHARSET" |
| 0x402 | HTML Attribute "ACCEPT" |
| 0x403 | HTML Attribute "ACCESSKEY" |
| 0x404 | HTML Attribute "ACTION" |
| 0x405 | HTML Attribute "ALIGN" |
| 0x406 | HTML Attribute "ALINK" |
| 0x407 | HTML Attribute "ALT" |
| 0x408 | HTML Attribute "ARCHIVE" |
| 0x409 | HTML Attribute "AXIS" |
| 0x40A | HTML Attribute "BACKGROUND" |
| 0x40B | HTML Attribute "BGCOLOR" |
| 0x40C | HTML Attribute "BORDER" |
| 0x40D | HTML Attribute "CELLPADDING" |
| 0x40E | HTML Attribute "CELLSPACING" |
| 0x40F | HTML Attribute "CHAR" |
| 0x410 | HTML Attribute "CHAROFF" |
| 0x411 | HTML Attribute "CHARSET" |
| 0x412 | HTML Attribute "CHECKED" |
| 0x413 | HTML Attribute "CITE" |
| 0x414 | HTML Attribute "CLASS" |
| 0x415 | HTML Attribute "CLASSID" |
| 0x416 | HTML Attribute "CLEAR" |
| 0x417 | HTML Attribute "CODE" |
| 0x418 | HTML Attribute "CODEBASE" |
| 0x419 | HTML Attribute "CODETYPE" |
| 0x41A | HTML Attribute "COLOR" |
| 0x41B | HTML Attribute "COLS" |
| 0x41C | HTML Attribute "COLSPAN" |
| 0x41D | HTML Attribute "COMPACT" |
| 0x41E | HTML Attribute "CONTENT" |
| 0x41F | HTML Attribute "COORDS" |
| 0x420 | HTML Attribute "DATA" |
| 0x421 | HTML Attribute "DATETIME" |
| 0x422 | HTML Attribute "DECLARE" |
| 0x423 | HTML Attribute "DEFER" |
| 0x424 | HTML Attribute "DIR" |
| 0x425 | HTML Attribute "DISABLED" |
| 0x426 | HTML Attribute "ENCTYPE" |
| 0x427 | HTML Attribute "FACE" |
| 0x428 | HTML Attribute "FOR" |
| 0x429 | HTML Attribute "FRAME" |
| 0x42A | HTML Attribute "FRAMEBORDER" |
| 0x42B | HTML Attribute "HEADERS" |
| 0x42C | HTML Attribute "HEIGHT" |
| 0x42D | HTML Attribute "HREF" |
| 0x42E | HTML Attribute "HREFLANG" |
| 0x42F | HTML Attribute "HSPACE" |
| 0x430 | HTML Attribute "HTTP-EQUIV" |
| 0x431 | HTML Attribute "ID" |
| 0x432 | HTML Attribute "ISMAP" |
| 0x433 | HTML Attribute "LABEL" |
| 0x434 | HTML Attribute "LANG" |
| 0x435 | HTML Attribute "LANGUAGE" |
| 0x436 | HTML Attribute "LINK" |
| 0x437 | HTML Attribute "LONGDESC" |
| 0x438 | HTML Attribute "MARGINHEIGHT" |
| 0x439 | HTML Attribute "MARGINWIDTH" |
| 0x43A | HTML Attribute "MAXLENGTH" |
| 0x43B | HTML Attribute "MEDIA" |
| 0x43C | HTML Attribute "METHOD" |
| 0x43D | HTML Attribute "MULTIPLE" |
| 0x43E | HTML Attribute "NAME" |
| 0x43F | HTML Attribute "NOHREF" |
| 0x440 | HTML Attribute "NORESIZE" |
| 0x441 | HTML Attribute "NOSHADE" |
| 0x442 | HTML Attribute "NOWRAP" |
| 0x443 | HTML Attribute "OBJECT" |
| 0x444 | HTML Attribute "ONBLUR" |
| 0x445 | HTML Attribute "ONCHANGE" |
| 0x446 | HTML Attribute "ONCLICK" |
| 0x447 | HTML Attribute "ONDBLCLICK" |

TABLE A-continued

| Token (hexadecimal) | Symbol |
|---|---|
| 0x448 | HTML Attribute "ONFOCUS" |
| 0x449 | HTML Attribute "ONKEYDOWN" |
| 0x44A | HTML Attribute "ONKEYPRESS" |
| 0x44B | HTML Attribute "ONKEYUP" |
| 0x44C | HTML Attribute "ONLOAD" |
| 0x44D | HTML Attribute "ONMOUSEDOWN" |
| 0x44E | HTML Attribute "ONMOUSEMOVE" |
| 0x44F | HTML Attribute "ONMOUSEOUT" |
| 0x450 | HTML Attribute "ONMOUSEOVER" |
| 0x451 | HTML Attribute "ONMOUSEUP" |
| 0x452 | HTML Attribute "ONRESET" |
| 0x453 | HTML Attribute "ONSELECT" |
| 0x454 | HTML Attribute "ONSUBMIT" |
| 0x455 | HTML Attribute "ONUNLOAD" |
| 0x456 | HTML Attribute "PROFILE" |
| 0x457 | HTML Attribute "PROMPT" |
| 0x458 | HTML Attribute "READONLY" |
| 0x459 | HTML Attribute "REL" |
| 0x45A | HTML Attribute "REV" |
| 0x45B | HTML Attribute "ROWS" |
| 0x45C | HTML Attribute "ROWSPAN" |
| 0x45D | HTML Attribute "RULES" |
| 0x45E | HTML Attribute "SCHEME" |
| 0x45F | HTML Attribute "SCOPE" |
| 0x460 | HTML Attribute "SCROLLING" |
| 0x461 | HTML Attribute "SELECTED" |
| 0x462 | HTML Attribute "SHAPE" |
| 0x463 | HTML Attribute "SIZE" |
| 0x464 | HTML Attribute "SPAN" |
| 0x465 | HTML Attribute "SRC" |
| 0x466 | HTML Attribute "STANDBY" |
| 0x467 | HTML Attribute "START" |
| 0x468 | HTML Attribute "STYLE" |
| 0x469 | HTML Attribute "SUMMARY" |
| 0x46A | HTML Attribute "TABINDEX" |
| 0x46B | HTML Attribute "TARGET" |
| 0x46C | HTML Attribute "TEXT" |
| 0x46D | HTML Attribute "TITLE" |
| 0x46E | HTML Attribute "TYPE" |
| 0x46F | HTML Attribute "USEMAP" |
| 0x470 | HTML Attribute "VALIGN" |
| 0x471 | HTML Attribute "VALUE" |
| 0x472 | HTML Attribute "VALUETYPE" |
| 0x473 | HTML Attribute "VERSION" |
| 0x474 | HTML Attribute "VLINK" |
| 0x475 | HTML Attribute "VSPACE" |
| 0x476 | HTML Attribute "WIDTH" |
| 0x500 | HTML Attribute "ABBR" followed by |
| 0x501 | HTML Attribute "ACCEPT-CHARSET" followed by "=" |
| 0x502 | HTML Attribute "ACCEPT" followed by "=" |
| 0x503 | HTML Attribute "ACCESSKEY" followed by |
| 0x504 | HTML Attribute "ACTION" followed by "=" |
| 0x505 | HTML Attribute "ALIGN" followed by "=" |
| 0x506 | HTML Attribute "ALINK" followed by "=" |
| 0x507 | HTML Attribute "ALT" followed by "=" |
| 0x508 | HTML Attribute "ARCHIVE" followed by "=" |
| 0x509 | HTML Attribute "AXIS" followed by "=" |
| 0x50A | HTML Attribute "BACKGROUND" followed by "=" |
| 0x50B | HTML Attribute "BGCOLOR" followed by "=" |
| 0x50C | HTML Attribute "BORDER" followed by "=" |
| 0x50D | HTML Attribute "CELLPADDING" followed by "=" |
| 0x50E | HTML Attribute "CELLSPACING" followed by "=" |
| 0x50F | HTML Attribute "CHAR" followed by "=" |
| 0x510 | HTML Attribute "CHAROFF" followed by "=" |
| 0x511 | HTML Attribute "CHARSET" followed by "=" |
| 0x512 | HTML Attribute "CHECKED" followed by "=" |
| 0x513 | HTML Attribute "CITE" followed by "=" |
| 0x514 | HTML Attribute "CLASS" followed by "=" |
| 0x515 | HTML Attribute "CLASSID" followed by "=" |
| 0x516 | HTML Attribute "CLEAR" followed by "=" |
| 0x517 | HTML Attribute "CODE" followed by "=" |
| 0x518 | HTML Attribute "CODEBASE" followed by "=" |
| 0x519 | HTML Attribute "CODETYPE" followed by "=" |

TABLE A-continued

| Token (hexadecimal) | Symbol |
|---|---|
| 0x51A | HTML Attribute "COLOR" followed by "=" |
| 0x51B | HTML Attribute "COLS" followed by "=" |
| 0x51C | HTML Attribute "COLSPAN" followed by "=" |
| 0x51D | HTML Attribute "COMPACT" followed by "=" |
| 0x51E | HTML Attribute "CONTENT" followed by "=" |
| 0x51F | HTML Attribute "COORDS" followed by "=" |
| 0x520 | HTML Attribute "DATA" followed by "=" |
| 0x521 | HTML Attribute "DATETIME" followed by "=" |
| 0x522 | HTML Attribute "DECLARE" followed by "=" |
| 0x523 | HTML Attribute "DEFER" followed by "=" |
| 0x524 | HTML Attribute "DIR" followed by "=" |
| 0x525 | HTML Attribute "DISABLED" followed by "=" |
| 0x526 | HTML Attribute "ENCTYPE" followed by "=" |
| 0x527 | HTML Attribute "FACE" followed by "=" |
| 0x528 | HTML Attribute "FOR" followed by "=" |
| 0x529 | HTML Attribute "FRAME" followed by "=" |
| 0x52A | HTML Attribute "FRAMEBORDER" followed by "=" |
| 0x52B | HTML Attribute "HEADERS" followed by "=" |
| 0x52C | HTML Attribute "HEIGHT" followed by "=" |
| 0x52D | HTML Attribute "HREF" followed by "=" |
| 0x52E | HTML Attribute "HREFLANG" followed by "=" |
| 0x52F | HTML Attribute "HSPACE" followed by "=" |
| 0x530 | HTML Attribute "HTTP-EQUIV" followed by "=" |
| 0x531 | HTML Attribute "ID" followed by "=" |
| 0x532 | HTML Attribute "ISMAP" followed by "=" |
| 0x533 | HTML Attribute "LABEL" followed by "=" |
| 0x534 | HTML Attribute "LANG" followed by "=" |
| 0x535 | HTML Attribute "LANGUAGE" followed by "=" |
| 0x536 | HTML Attribute "LINK" followed by "=" |
| 0x537 | HTML Attribute "LONGDESC" followed by "=" |
| 0x538 | HTML Attribute "MARGINHEIGHT" followed by "=" |
| 0x539 | HTML Attribute "MARGINWIDTH" followed by "=" |
| 0x53A | HTML Attribute "MAXLENGTH" followed by "=" |
| 0x53B | HTML Attribute "MEDIA" followed by "=" |
| 0x53C | HTML Attribute "METHOD" followed by "=" |
| 0x53D | HTML Attribute "MULTIPLE" followed by "=" |
| 0x53E | HTML Attribute "NAME" followed by "=" |
| 0x53F | HTML Attribute "NOHREF" followed by "=" |
| 0x540 | HTML Attribute "NORESIZE" followed by "=" |
| 0x541 | HTML Attribute "NOSHADE" followed by "=" |
| 0x542 | HTML Attribute "NOWRAP" followed by "=" |
| 0x543 | HTML Attribute "OBJECT" followed by "=" |
| 0x544 | HTML Attribute "ONBLUR" followed by "=" |
| 0x545 | HTML Attribute "ONCHANGE" followed by "=" |
| 0x546 | HTML Attribute "ONCLICK" followed by "=" |
| 0x547 | HTML Attribute "ONDBLCLICK" followed by "=" |
| 0x548 | HTML Attribute "ONFOCUS" followed by "=" |
| 0x549 | HTML Attribute "ONKEYDOWN" followed by "=" |
| 0x54A | HTML Attribute "ONKEYPRESS" followed by "=" |
| 0x54B | HTML Attribute "ONKEYUP" followed by "=" |
| 0x54C | HTML Attribute "ONLOAD" followed by "=" |
| 0x54D | HTML Attribute "ONMOUSEDOWN" followed by "=" |
| 0x54E | HTML Attribute "ONMOUSEMOVE" followed by "=" |
| 0x54F | HTML Attribute "ONMOUSEOUT" followed by "=" |
| 0x550 | HTML Attribute "ONMOUSEOVER" followed by "=" |
| 0x551 | HTML Attribute "ONMOUSEUP" followed by "=" |
| 0x552 | HTML Attribute "ONRESET" followed by "=" |
| 0x553 | HTML Attribute "ONSELECT" followed by "=" |
| 0x554 | HTML Attribute "ONSUBMIT" followed by "=" |
| 0x555 | HTML Attribute "ONUNLOAD" followed by "=" |
| 0x556 | HTML Attribute "PROFILE" followed by "=" |
| 0x557 | HTML Attribute "PROMPT" followed by "=" |
| 0x558 | HTML Attribute "READONLY" followed by "=" |

TABLE A-continued

| Token (hexadecimal) | Symbol |
|---|---|
| 0x559 | HTML Attribute "REL" followed by "=" |
| 0x55A | HTML Attribute "REV" followed by "=" |
| 0x55B | HTML Attribute "ROWS" followed by "=" |
| 0x55C | HTML Attribute "ROWSPAN" followed by "=" |
| 0x55D | HTML Attribute "RULES" followed by "=" |
| 0x55E | HTML Attribute "SCHEME" followed by "=" |
| 0x55F | HTML Attribute "SCOPE" followed by "=" |
| 0x560 | HTML Attribute "SCROLLING" followed by "=" |
| 0x561 | HTML Attribute "SELECTED" followed by "=" |
| 0x562 | HTML Attribute "SHAPE" followed by "=" |
| 0x563 | HTML Attribute "SIZE" followed by "=" |
| 0x564 | HTML Attribute "SPAN" followed by "=" |
| 0x565 | HTML Attribute "SRC" followed by "=" |
| 0x566 | HTML Attribute "STANDBY" followed by "=" |
| 0x567 | HTML Attribute "START" followed by "=" |
| 0x568 | HTML Attribute "STYLE" followed by "=" |
| 0x569 | HTML Attribute "SUMMARY" followed by "=" |
| 0x56A | HTML Attribute "TABINDEX" followed by "=" |
| 0x56B | HTML Attribute "TARGET" followed by "=" |
| 0x56C | HTML Attribute "TEXT" followed by "=" |
| 0x56D | HTML Attribute "TITLE" followed by "=" |
| 0x56E | HTML Attribute "TYPE" followed by "=" |
| 0x56F | HTML Attribute "USEMAP" followed by "=" |
| 0x570 | HTML Attribute "VALIGN" followed by "=" |
| 0x571 | HTML Attribute "VALUE" followed by "=" |
| 0x572 | HTML Attribute "VALUETYPE" followed by "=" |
| 0x573 | HTML Attribute "VERSION" followed by "=" |
| 0x574 | HTML Attrtbute "VLINK" followed by "=" |
| 0x575 | HTML Attribute "VSPACE" followed by "=" |
| 0x576 | HTML Attribute "WIDTH" followed by "=" |
| 0x600 | Single quote, closing an attribute value " |
| 0x700 | Double quote, within an attribute value "" |
| 0x800 | Carriage-return/Line-feed sequence |
| 0x900 | Start of dynamic token definition |
| 0xA00 through 0xAFF | Reserved for dynamic assignment by compressor |

TABLE B

| Token | Huffman Code |
|---|---|
| 0x000 | 110000001000111001110000 |
| 0x001 | 110000001000111001110001 |
| 0x002 | 110000001000111001110010 |
| 0x003 | 110000001000111001110011 |
| 0x004 | 110000001000111001110100 |
| 0x005 | 110000001000111001110101 |
| 0x006 | 110000001000111001110110 |
| 0x007 | 110000001000111001110111 |
| 0x008 | 110000001000111001111000 |
| 0x009 | 1000110010 |
| 0x00A | 110000001101101110 |
| 0x00B | 110000001000111001000001 |
| 0x00C | 110000001000111001000010 |
| 0x00D | 110000001101101111 |
| 0x00E | 110000001000111001000011 |
| 0x00F | 110000001000111001000100 |
| 0x010 | 110000001000111001000101 |
| 0x011 | 110000001000111001000110 |
| 0x012 | 110000001000111001000111 |
| 0x013 | 110000001000111001001000 |
| 0x014 | 110000001000111001001001 |
| 0x015 | 110000001000111001001010 |
| 0x016 | 110000001000111001001011 |
| 0x017 | 110000001000111001001100 |
| 0x018 | 110000001000111001001101 |
| 0x019 | 110000001000111001001110 |
| 0x01A | 110000001000111001001111 |
| 0x01B | 110000001000111001010000 |
| 0x01C | 110000001000111001010001 |
| 0x01D | 110000001000111001010010 |
| 0x01E | 110000001000111001010011 |
| 0x01F | 110000001000111001010100 |
| 0x020 | 001 |

TABLE B-continued

| Token | Huffman Code |
|---|---|
| 0x021 | 100011010 |
| 0x022 | 010001011 |
| 0x023 | 1101110111 |
| 0x024 | 110111110111000 |
| 0x025 | 0100010010 |
| 0x026 | 100001101 |
| 0x027 | 11011100 |
| 0x028 | 01110011 |
| 0x029 | 01111000 |
| 0x02A | 110000001110 |
| 0x02B | 110111011001 |
| 0x02C | 0100011 |
| 0x02D | 1111011 |
| 0x02E | 111000 |
| 0x02F | 111001 |
| 0x030 | 1111001 |
| 0x031 | 0111101 |
| 0x032 | 10110100 |
| 0x033 | 110010110 |
| 0x034 | 00010001 |
| 0x035 | 110111111 |
| 0x036 | 110010001 |
| 0x037 | 011100001 |
| 0x038 | 011100101 |
| 0x039 | 110000010 |
| 0x03A | 11110001 |
| 0x03B | 011100011 |
| 0x03C | 100011000 |
| 0x03D | 11011110 |
| 0x03E | 100001100 |
| 0x03F | 100001010 |
| 0x040 | 1000010110011 |
| 0x041 | 10110101 |
| 0x042 | 000100001 |
| 0x043 | 000010100 |
| 0x044 | 110010101 |
| 0x045 | 111100000 |
| 0x046 | 111100001 |
| 0x047 | 0111001000 |
| 0x048 | 1101110101 |
| 0x049 | 110010010 |
| 0x04A | 11011111010 |
| 0x04B | 01111001100 |
| 0x04C | 101100110 |
| 0x04D | 110010011 |
| 0x04E | 100001001 |
| 0x04F | 1100101001 |
| 0x050 | 10110001 |
| 0x051 | 011100010111 |
| 0x052 | 00010111 |
| 0x053 | 10110000 |
| 0x054 | 0001001 |
| 0x055 | 1100100000 |
| 0x056 | 10110011111 |
| 0x057 | 1101110100 |
| 0x058 | 011100010101 |
| 0x059 | 00010000001 |
| 0x05A | 1011001110011 |
| 0x05B | 1101110110000 |
| 0x05C | 10110010 |
| 0x05D | 1100101000001 |
| 0x05E | 01110001011010111 |
| 0x05F | 10000111 |
| 0x060 | 01000100110011110011 |
| 0x061 | 11111 |
| 0x062 | 010000 |
| 0x063 | 01001 |
| 0x064 | 110001 |
| 0x065 | 1010 |
| 0x066 | 100000 |
| 0x067 | 1100001 |
| 0x068 | 01101 |
| 0x069 | 0000 |
| 0x06A | 110000000 |
| 0x06B | 00010110 |
| 0x06C | 01100 |
| 0x06D | 110110 |

TABLE B-continued

| Token | Huffman Code |
|---|---|
| 0x06E | 10111 |
| 0x06F | 0101 |
| 0x070 | 00011 |
| 0x071 | 0111100111 |
| 0x072 | 11101 |
| 0x073 | 11010 |
| 0x074 | 1001 |
| 0x075 | 100010 |
| 0x076 | 1011011 |
| 0x077 | 110011 |
| 0x078 | 00010101 |
| 0x079 | 1000111 |
| 0x07A | 10000101101 |
| 0x07B | 11000000111100 |
| 0x07C | 1011001110001 |
| 0x07D | 11000000110111 |
| 0x07E | 110000001001 |
| 0x07F | 11000000100011101010101 |
| 0x080 | 11000000100011101010110 |
| 0x081 | 11000000100011101010111 |
| 0x082 | 11000000100011101011000 |
| 0x083 | 11000000100011101011001 |
| 0x084 | 11000000100011101011010 |
| 0x085 | 110000010000110101 |
| 0x086 | 11000000100011101011011 |
| 0x087 | 01111001101100010110 |
| 0x088 | 11000000100011101011100 |
| 0x089 | 11000000100011101011101 |
| 0x08A | 11000000100011101011110 |
| 0x08B | 11000000100011101011111 |
| 0x08C | 11000000100011101100000 |
| 0x08D | 11000000100011101100001 |
| 0x08E | 11000000100011101100010 |
| 0x08F | 11000000100011101100011 |
| 0x090 | 11000000100011101100100 |
| 0x091 | 0111000101100001 |
| 0x092 | 0001000001011 |
| 0x093 | 01111001101100010 1110 |
| 0x094 | 01111001101100010 1111 |
| 0x095 | 11000000100011101100101 |
| 0x096 | 0111000101101011001 |
| 0x097 | 0111100110110001 10000 |
| 0x098 | 11000000100011101100110 |
| 0x099 | 11000000111101100 01 |
| 0x09A | 11000000100011101100111 |
| 0x09B | 11000000100011101101000 |
| 0x09C | 11000000100011101101001 |
| 0x09D | 11000000100011101101010 |
| 0x09E | 11000000100011101101011 |
| 0x09F | 11000000100011101101100 |
| 0x0A0 | 110000001000000 |
| 0x0A1 | 11000000100011101101101 |
| 0x0A2 | 11000000100011101101110 |
| 0x0A3 | 110000001111011100111 |
| 0x0A4 | 110000010001110101111 |
| 0x0A5 | 11000000100011101110000 |
| 0x0A6 | 11000000100011101110001 |
| 0x0A7 | 1100000010000 1100 |
| 0x0A8 | 11000000100011101110010 |
| 0x0A9 | 1000101100100 10101 |
| 0x0AA | 11000000100011101110011 |
| 0x0AB | 11000000100011101110100 |
| 0x0AC | 11000000100011101110101 |
| 0x0AD | 11000000100011101110110 |
| 0x0AE | 11000000110110110 |
| 0x0AF | 11000000100011101110111 |
| 0x0B0 | 110000001000011000 |
| 0x0B1 | 11000000100011101111000 |
| 0x0B2 | 01111001101100010001 |
| 0x0B3 | 11000000100011101111001 |
| 0x0B4 | 11000000100011101111010 |
| 0x0B5 | 01111001101100010010 |
| 0x0B6 | 11000000100011101111011 |
| 0x0B7 | 11000000100011101111100 |
| 0x0B8 | 11000000100011101111101 |
| 0x0B9 | 11000000100011101111110 |
| 0x0BA | 1101111101110101 11110 |
| 0x0BB | 11000000100011101111111 |
| 0x0BC | 11000000100011110000000 |
| 0x0BD | 110000001000111001 0110 |
| 0x0BE | 11000000100011110000001 |
| 0x0BF | 11000000100011110000010 |
| 0x0C0 | 11000000100011110000011 |
| 0x0C1 | 11000000100011110000100 |
| 0x0C2 | 11000000100011110000101 |
| 0x0C3 | 11000000100011110000110 |
| 0x0C4 | 01111001101100010011 |
| 0x0C5 | 011110011011000110100 |
| 0x0C6 | 11000000100011110000111 |
| 0x0C7 | 11000000100011110001000 |
| 0x0C8 | 11000000100011110001001 |
| 0x0C9 | 11000000100011110001010 |
| 0x0CA | 11000000100011110001011 |
| 0x0CB | 11000000100011110001100 |
| 0x0CC | 11000000100011110001101 |
| 0x0CD | 11000000100011110001110 |
| 0x0CE | 11000000100011110001111 |
| 0x0CF | 11000000100011110010000 |
| 0x0D0 | 11000000100011110010001 |
| 0x0D1 | 11000000100011110010010 |
| 0x0D2 | 11000000100011110010011 |
| 0x0D3 | 11000000100011110010100 |
| 0x0D4 | 11000000100011110010101 |
| 0x0D5 | 11000000100011110010110 |
| 0x0D6 | 1100000011110111000 |
| 0x0D7 | 11000000100011110010111 |
| 0x0D8 | 11000000100011110011000 |
| 0x0D9 | 11000000100011110011001 |
| 0x0DA | 11000000100011110011010 |
| 0x0DB | 11000000100011110011011 |
| 0x0DC | 11000000100011110011100 |
| 0x0DD | 11000000100011110011101 |
| 0x0DE | 11000000100011110011110 |
| 0x0DF | 11000000100011110011111 |
| 0x0E0 | 11000000100011110100000 |
| 0x0E1 | 11000000100011110100001 |
| 0x0E2 | 11000000100011110100010 |
| 0x0E3 | 11000000100011110100011 |
| 0x0E4 | 110000001000111001 0111 |
| 0x0E5 | 1101111101110010110 |
| 0x0E6 | 11000000100011110100100 |
| 0x0E7 | 11000000100011110100101 |
| 0x0E8 | 11000000100011110100110 |
| 0x0E9 | 0100100110011111101 |
| 0x0EA | 11000000100011110100111 |
| 0x0EB | 11000000100011110101000 |
| 0x0EC | 11000000100011110101001 |
| 0x0ED | 11000000100011110101010 |
| 0x0EE | 11000000100011110101011 |
| 0x0EF | 11000000100011110101100 |
| 0x0F0 | 11000000100011110101101 |
| 0x0F1 | 11000000100011110101110 |
| 0x0F2 | 11000000100011110101111 |
| 0x0F3 | 11000000100011110110000 |
| 0x0F4 | 11000000100011110110001 |
| 0x0F5 | 11000000100011110110010 |
| 0x0F6 | 10001101100011010 0 |
| 0x0F7 | 11000000100011110110011 |
| 0x0F8 | 11000000100011110110100 |
| 0x0F9 | 11000000100011110110101 |
| 0x0FA | 11000000100011110110110 |
| 0x0FB | 11000000100011110110111 |
| 0x0EC | 010010011000011 00 |
| 0x0FD | 11000000100011110111000 |
| 0x0FE | 11000000100011110111001 |
| 0x0FF | 11000000100011110111010 |
| 0x100 | 1111010001 |
| 0x101 | 11000000100011110111011 |
| 0x102 | 11000000100011110111100 |
| 0x103 | 11011111011 10101100 |
| 0x104 | 11000000100011 1000100 |
| 0x105 | 1011001110101 |
| 0x106 | 10001100111 |
| 0x107 | 100011011000111011 |

TABLE B-continued

| Token | Huffman Code |
|---|---|
| 0x108 | 11000000100011110111101 |
| 0x109 | 11000000100011110111110 |
| 0x10A | 100001011000010 |
| 0x10B | 11011111011100110 |
| 0x10C | 10001101100001 |
| 0x10D | 1000110111 |
| 0x10E | 11000000100011110111111 |
| 0x10F | 110111110110101111111 |
| 0x110 | 11011101100011 |
| 0x111 | 10000101100010000 |
| 0x112 | 11011111011101111 |
| 0x113 | 110111101110111100000 |
| 0x114 | 011110011011000110101 |
| 0x115 | 01110010010 |
| 0x116 | 11000000100011111000000 |
| 0x117 | 11000000100011111000001 |
| 0x118 | 010001001100001101 |
| 0x119 | 110111110111101011010 |
| 0x11A | 100011011011001000 |
| 0x11B | 01110000000 |
| 0x11C | 100011011000101 |
| 0x11D | 11000000100011111000010 |
| 0x11E | 100001000 |
| 0x11F | 1000110110001111 |
| 0x13D | 11000000100011111001010 |
| 0x13E | 10110011110 |
| 0x13F | 010001010 |
| 0x140 | 1101111101110010111 |
| 0x141 | 01110001010000010 |
| 0x142 | 11000000100011111001011 |
| 0x143 | 11000000100011111001100 |
| 0x144 | 11000000100011111001101 |
| 0x145 | 01111001101111 |
| 0x146 | 10000101100000110 |
| 0x147 | 1000110110111 |
| 0x148 | 110111110111011100010 |
| 0x149 | 11000000100011111001110 |
| 0x14A | 011100100111 |
| 0x14B | 11000000100011100011000 |
| 0x14C | 011100010110000010 |
| 0x14D | 01900100110000111 |
| 0x14E | 1100000011111 |
| 0x14F | 11000000100011111001111 |
| 0x150 | 110000011 |
| 0x151 | 11000000111101100111 |
| 0x152 | 11000000100011111010000 |
| 0x153 | 110000001100 |
| 0x154 | 11000000100011111010001 |
| 0x155 | 10001101101010 |
| 0x156 | 0111000100 |
| 0x157 | 01110001011010101 |
| 0x158 | 01110001011001 |
| 0x159 | 1101111101111 |
| 0x15A | 11000000100011111010010 |
| 0x200 | 1111010000 |
| 0x201 | 11000000100011111010011 |
| 0x202 | 11000000100011111010100 |
| 0x203 | 110111110111010101000 |
| 0x204 | 11000000100011000110 |
| 0x205 | 11000000100011111010101 |
| 0x206 | 10001100110 |
| 0x207 | 11000000100011111010110 |
| 0x208 | 11000000100011111010111 |
| 0x209 | 11000000100011111011000 |
| 0x20A | 1101111101110110 |
| 0x20B | 11011111011100111 |
| 0x20C | 10000101100011 |
| 0x20D | 011110011011000110111 |
| 0x20E | 11000000100011111011001 |
| 0x20F | 110111101110110011011001 |
| 0x210 | 11011101100010 |
| 0x211 | 10000101100010001 |
| 0x212 | 0100010011000010 |
| 0x213 | 11000000100011111011010 |
| 0x214 | 01111001101100011000 |
| 0x215 | 0111100110110000 |
| 0x216 | 11000000100011111011011 |
| 0x217 | 11000000100011111011100 |
| 0x218 | 011100010110000000 |
| 0x219 | 0111000101101011000 |
| 0x21A | 100011011011001001 |
| 0x21B | 100001011001001011 |
| 0x21C | 10001101110000110 |
| 0x21D | 11000000100011111011101 |
| 0x21E | 011110010 |
| 0x21F | 1000010110010011 |
| 0x220 | 11000000100011111011110 |
| 0x221 | 011100010110000001 |
| 0x222 | 100001011001000 |
| 0x223 | 00010000010101 |
| 0x224 | 011100010110100 |
| 0x225 | 0111000101101010 |
| 0x226 | 01111001101100001010 |
| 0x227 | 11000000100011000111 |
| 0x228 | 10000101100101 |
| 0x229 | 11000000100011111011111 |
| 0x22A | 10001101101101 |
| 0x22B | 010001000000 |
| 0x22C | 11000000100011111100000 |
| 0x22D | 11000000100011111100001 |
| 0x22E | 11000000100011111100010 |
| 0x22F | 11000000100011111100011 |
| 0x230 | 11000000100011111100100 |
| 0x231 | 11000000100011111100101 |
| 0x232 | 010001001100101 |
| 0x233 | 11000000100011111100110 |
| 0x234 | 1100000011010 |
| 0x235 | 11000000100011111100111 |
| 0x236 | 11011111011100100 |
| 0x237 | 11000000100011111101000 |
| 0x238 | 11000000100011111101001 |
| 0x239 | 110111110111011100100 |
| 0x23A | 11000000100011111101010 |
| 0x23B | 110000001000110011001 |
| 0x23C | 110000001000010 |
| 0x23D | 11000000100011111101011 |
| 0x23E | 101100111001011 |
| 0x23F | 110111110110 |
| 0x240 | 11000000100011111101100 |
| 0x241 | 0111000101000011 |
| 0x242 | 11000000100011111101101 |
| 0x243 | 11000000100011111101110 |
| 0x244 | 11000000100011111101111 |
| 0x245 | 10000101100000 |
| 0x246 | 10000101100000111 |
| 0x247 | 1011001110000 |
| 0x248 | 110111110111011100101 |
| 0x249 | 11000000100011111110000 |
| 0x24A | 011110011010 |
| 0x24B | 110000001000110011010 |
| 0x24C | 011100010110000011 |
| 0x24D | 01000100110011110 |
| 0x24E | 1100101000000 |
| 0x24F | 11000000100011111110001 |
| 0x250 | 110010111 |
| 0x251 | 11000000111101110010 |
| 0x252 | 11000000100011111110010 |
| 0x253 | 01000100110001 |
| 0x254 | 11000000100011111110011 |
| 0x255 | 10001101101011 |
| 0x256 | 0111000001 |
| 0x257 | 100001011001001000 |
| 0x258 | 011100010110011 |
| 0x259 | 000100000100 |
| 0x25A | 11000000100011111110100 |
| 0x25B | 011111 |
| 0x400 | 11000000100011111110101 |
| 0x401 | 11000000100011111110110 |
| 0x402 | 11000000100011111110111 |
| 0x403 | 11000000100011111111000 |
| 0x404 | 11000000100011111111001 |
| 0x405 | 11000000100011111111010 |
| 0x406 | 11000000100011111111011 |
| 0x407 | 11000000100011111111100 |

TABLE B-continued

| Token | Huffman Code |
|---|---|
| 0x408 | 11000000100011111111101 |
| 0x409 | 11000000100011111111110 |
| 0x40A | 11000000100011111111111 |
| 0x40B | 11000000110110100000000 |
| 0x40C | 11000000110110100000001 |
| 0x40D | 11000000110110100000010 |
| 0x40E | 11000000110110100000011 |
| 0x40F | 11000000110110100000100 |
| 0x410 | 11000000110110100000101 |
| 0x411 | 11000000110110100000110 |
| 0x412 | 11000000110110100000111 |
| 0x413 | 11000000110110100001000 |
| 0x414 | 11000000110110100001001 |
| 0x415 | 11000000110110100001010 |
| 0x416 | 11000000110110100001011 |
| 0x417 | 11000000110110100001100 |
| 0x418 | 11000000110110100001101 |
| 0x419 | 11000000110110100001110 |
| 0x41A | 11000000110110100001111 |
| 0x41B | 11000000110110100010000 |
| 0x41C | 11000000110110100010001 |
| 0x41D | 11000000110110100010010 |
| 0x41E | 11000000110110100010011 |
| 0x41F | 11000000110110100010100 |
| 0x420 | 11000000110110100010101 |
| 0x421 | 11000000110110100010110 |
| 0x422 | 11000000110110100010111 |
| 0x423 | 11000000110110100011000 |
| 0x424 | 11000000110110100011001 |
| 0x425 | 11000000110110100011010 |
| 0x426 | 11000000110110100011011 |
| 0x427 | 11000000110110100011100 |
| 0x428 | 11000000110110100011101 |
| 0x429 | 11000000110110100011110 |
| 0x42A | 11000000110110100011111 |
| 0x42B | 11000000110110100100000 |
| 0x42C | 11000000110110100100001 |
| 0x42D | 11000000110110100100010 |
| 0x42E | 11000000110110100100011 |
| 0x42F | 11000000110110100100100 |
| 0x430 | 11000000110110100100101 |
| 0x431 | 11000000110110100100110 |
| 0x432 | 11000000110110100100111 |
| 0x433 | 11000000110110100101000 |
| 0x434 | 11000000110110100101001 |
| 0x435 | 11000000110110100101010 |
| 0x436 | 11000000110110100101011 |
| 0x437 | 11000000110110100101100 |
| 0x438 | 11000000110110100101101 |
| 0x439 | 11000000110110100101110 |
| 0x43A | 11000000110110100101111 |
| 0x43B | 11000000110110100110000 |
| 0x43C | 11000000110110100110001 |
| 0x43D | 11000000110110100110010 |
| 0x43E | 11000000110110100110011 |
| 0x43F | 11000000110110100110100 |
| 0x440 | 11000000110110100110101 |
| 0x441 | 11000000110110100110110 |
| 0x442 | 11000000110110100110111 |
| 0x443 | 11000000110110100111000 |
| 0x444 | 11000000110110100111001 |
| 0x445 | 11000000110110100111010 |
| 0x446 | 11000000110110100111011 |
| 0x447 | 11000000110110100111100 |
| 0x448 | 11000000110110100111101 |
| 0x449 | 11000000110110100111110 |
| 0x44A | 11000000110110100111111 |
| 0x44B | 11000000110110101000000 |
| 0x44C | 11000000110110101000001 |
| 0x44D | 11000000110110101000010 |
| 0x44E | 11000000110110101000011 |
| 0x44F | 11000000110110101000100 |
| 0x450 | 11000000110110101000101 |
| 0x451 | 11000000110110101000110 |
| 0x452 | 11000000110110101000111 |
| 0x453 | 11000000110110101001000 |
| 0x454 | 11000000110110101001001 |
| 0x455 | 11000000110110101001010 |
| 0x456 | 11000000110110101001011 |
| 0x457 | 11000000110110101001100 |
| 0x458 | 11000000110110101001101 |
| 0x459 | 11000000110110101001110 |
| 0x45A | 11000000110110101001111 |
| 0x45B | 11000000110110101010000 |
| 0x45C | 11000000110110101010001 |
| 0x45D | 11000000110110101010010 |
| 0x45E | 11000000110110101010011 |
| 0x45F | 11000000110110101010100 |
| 0x460 | 11000000110110101010101 |
| 0x461 | 11000000110110101010110 |
| 0x462 | 11000000110110101010111 |
| 0x463 | 11000000110110101011000 |
| 0x464 | 11000000110110101011001 |
| 0x465 | 11000000110110101011010 |
| 0x466 | 11000000110110101011011 |
| 0x467 | 11000000110110101011100 |
| 0x468 | 11000000110110101011101 |
| 0x469 | 11000000110110101011110 |
| 0x46A | 11000000110110101011111 |
| 0x46B | 11000000110110101100000 |
| 0x46C | 11000000110110101100001 |
| 0x46D | 11000000110110101100010 |
| 0x46E | 11000000110110101100011 |
| 0x46F | 11000000110110101100100 |
| 0x470 | 11000000110110101100101 |
| 0x471 | 11000000110110101100110 |
| 0x472 | 11000000110110101100111 |
| 0x473 | 11000000110110101101000 |
| 0x474 | 11000000110110101101001 |
| 0x475 | 11000000110110101101010 |
| 0x476 | 11000000110110101101011 |
| 0x500 | 11000000110110101101100 |
| 0x501 | 11000000110110101101101 |
| 0x502 | 11000000110110101101110 |
| 0x503 | 11000000110110101101111 |
| 0x504 | 0111100110110010 |
| 0x505 | 1111010011 |
| 0x506 | 1100000010000111 |
| 0x507 | 110010100001 |
| 0x508 | 11000000110110101110000 |
| 0x509 | 11000000110110101110001 |
| 0x50A | 011100010110001 |
| 0x50B | 1000110110010 |
| 0x50C | 110111011010 |
| 0x50D | 1000110110100 |
| 0x50E | 10110011101001 |
| 0x50F | 11000000110110101110010 |
| 0x510 | 11000000110110101110011 |
| 0x511 | 11000000100011100000 |
| 0x512 | 1000110110110011 |
| 0x513 | 11000000110110101110100 |
| 0x514 | 01000100001 |
| 0x515 | 01111001101100011001 |
| 0x516 | 110000001111011101 |
| 0x517 | 11000000100011001000 |
| 0x518 | 11000000100011001001 |
| 0x519 | 11000000110110101110101 |
| 0x51A | 11000000101 |
| 0x51B | 100011011011001011 |
| 0x51C | 0111000101001 |
| 0x51D | 11000000110110101110110 |
| 0x51E | 10110011101000 |
| 0x51F | 1011001110110 |
| 0x520 | 11000000110110101110111 |
| 0x521 | 11000000110110101111000 |
| 0x522 | 11000000110110101111001 |
| 0x523 | 11000000110110101111010 |
| 0x524 | 11000000110110101111011 |
| 0x525 | 11000000110110101111100 |
| 0x526 | 11000000100011100011011 |
| 0x527 | 1111010010 |
| 0x528 | 010001001100110 |
| 0x529 | 11011111011101011011 |
| 0x52A | 01111001101100011010 |

TABLE B-continued

| Token | Huffman Code |
|---|---|
| 0x52B | 1100000011011010111101 |
| 0x52C | 0100010001 |
| 0x52D | 1101111100 |
| 0x52E | 1100000011011010111110 |
| 0x52F | 110000001111010 |
| 0x530 | 100011011011000 |
| 0x531 | 010001001100000 |
| 0x532 | 1100000011011010111111 |
| 0x533 | 110000001111010000000 |
| 0x534 | 110000001000011011 |
| 0x535 | 01111001101110 |
| 0x536 | 110000001000110 |
| 0x537 | 110000001111010000001 |
| 0x538 | 100011011000111000 |
| 0x539 | 100001011001001001 |
| 0x53A | 1101111101011001010 |
| 0x53B | 110000001111010000010 |
| 0x53C | 0111100110110011 |
| 0x53D | 110000001111010000011 |
| 0x53E | 01110000001 |
| 0x53F | 110000001111010000100 |
| 0x540 | 110000001111010000101 |
| 0x541 | 110000001111010000110 |
| 0x542 | 110000001111010000111 |
| 0x543 | 110000001111010001000 |
| 0x544 | 110000001111010001001 |
| 0x545 | 110000001110110010 |
| 0x546 | 11011111011101001 |
| 0x547 | 110000001111010001010 |
| 0x548 | 110000001111010001011 |
| 0x549 | 110000001111010001100 |
| 0x54A | 011110011011000111011 |
| 0x54B | 11000000100011100001 |
| 0x54C | 11011111011101011100 |
| 0x54D | 110000001111010001101 |
| 0x54E | 110000001111010001110 |
| 0x54F | 01110001010001 |
| 0x550 | 01111001101101 |
| 0x551 | 110000001111010001111 |
| 0x552 | 110000001111010011000 |
| 0x553 | 110000001111010011001 |
| 0x554 | 11011111011101110110 |
| 0x555 | 110000001111010011010 |
| 0x556 | 110000001111010011011 |
| 0x557 | 110000001111010011100 |
| 0x558 | 110000001111010011101 |
| 0x559 | 11011111011101011010 |
| 0x55A | 11011111011101110111 |
| 0x55B | 100011011011010100 |
| 0x55C | 1100000001111101101 |
| 0x55D | 11011111011101011110 |
| 0x55E | 110000001111010011010110 |
| 0x55F | 110000001111010011011 |
| 0x560 | 100011011000111001 |
| 0x561 | 010001001100111100 |
| 0x562 | 10110011110111 |
| 0x563 | 1000010111 |
| 0x564 | 110000001111011001100 |
| 0x565 | 110111011011 |
| 0x566 | 110000001111011001101 |
| 0x567 | 0100010011001110 |
| 0x568 | 1101111101101000 |
| 0x569 | 110000001111011001101 |
| 0x56A | 110000001111011001111 |
| 0x56B | 110000001101100 |
| 0x56C | 100011011000100 |
| 0x56D | 011110011011000100 |
| 0x56E | 011100100110 |
| 0x56F | 1101111101110101 |
| 0x570 | 010001001111 |
| 0x571 | 11001010001 |
| 0x572 | 110000001000111001010 |
| 0x573 | 010001001100111100100 |
| 0x574 | 101100111001010 |
| 0x575 | 11011111011101001 |
| 0x576 | 1100100001 |
| 0x600 | 011101 |

TABLE B-continued

| Token | Huffman Code |
|---|---|
| 0x700 | 01000100110011111100101 |
| 0x800 | 11110101 |
| 0x900 | 100001011001001010011111110 |
| 0xA00 | 100001011001001010011111111 |
| 0xA01 | 0111100110110001110000000 |
| 0xA02 | 0111100110110001110000001 |
| 0xA03 | 0111100110110001110000010 |
| 0xA04 | 0111100110110001110000011 |
| 0xA05 | 0111100110110001110000100 |
| 0xA06 | 0111100110110001110000101 |
| 0xA07 | 0111100110110001110000110 |
| 0xA08 | 0111100110110001110000111 |
| 0xA09 | 0111100110110001110001000 |
| 0xA0A | 0111100110110001110001001 |
| 0xA0B | 0111100110110001110001010 |
| 0xA0C | 0111100110110001110001011 |
| 0xA0D | 0111100110110001110001100 |
| 0xA0E | 0111100110110001110001101 |
| 0xA0F | 0111100110110001110001110 |
| 0xA10 | 0111100110110001110001111 |
| 0xA11 | 0111100110110001110010000 |
| 0xA12 | 0111100110110001110010001 |
| 0xA13 | 0111100110110001110010010 |
| 0xA14 | 0111100110110001110010011 |
| 0xA15 | 0111100110110001110010100 |
| 0xA16 | 0111100110110001110010101 |
| 0xA17 | 0111100110110001110010110 |
| 0xA18 | 0111100110110001110010111 |
| 0xA19 | 0111100110110001110011000 |
| 0xA1A | 0111100110110001110011001 |
| 0xA1B | 0111100110110001110011010 |
| 0xA1C | 0111100110110001110011011 |
| 0xA1D | 0111100110110001110011100 |
| 0xA1E | 0111100110110001110011101 |
| 0xA1F | 0111100110110001110011110 |
| 0xA20 | 0111100110110001110011111 |
| 0xA21 | 0111100110110001110100000 |
| 0xA22 | 0111100110110001110100001 |
| 0xA23 | 0111100110110001110100010 |
| 0xA24 | 0111100110110001110100011 |
| 0xA25 | 0111100110110001110100100 |
| 0xA26 | 0111100110110001110100101 |
| 0xA27 | 0111100110110001110100110 |
| 0xA28 | 0111100110110001110100111 |
| 0xA29 | 0111100110110001110101000 |
| 0xA2A | 0111100110110001110101001 |
| 0xA2B | 0111100110110001110101010 |
| 0xA2C | 0111100110110001110101011 |
| 0xA2D | 0111100110110001110101100 |
| 0xA2E | 0111100110110001110101101 |
| 0xA2F | 0111100110110001110101110 |
| 0xA30 | 0111100110110001110101111 |
| 0xA31 | 0111100110110001110110000 |
| 0xA32 | 0111100110110001110110001 |
| 0xA33 | 0111100110110001110110010 |
| 0xA34 | 0111100110110001110110011 |
| 0xA35 | 0111100110110001110110100 |
| 0xA36 | 0111100110110001110110101 |
| 0xA37 | 0111100110110001110110110 |
| 0xA38 | 0111100110110001110110111 |
| 0xA39 | 0111100110110001110111000 |
| 0xA3A | 0111100110110001110111001 |
| 0xA3B | 0111100110110001110111010 |
| 0xA3C | 0111100110110001110111011 |
| 0xA3D | 0111100110110001110111100 |
| 0xA3E | 0111100110110001110111101 |
| 0xA3F | 0111100110110001110111110 |
| 0xA40 | 0111100110110001110111111 |
| 0xA41 | 0111100110110001111000000 |
| 0xA42 | 0111100110110001111000001 |
| 0xA43 | 0111100110110001111000010 |
| 0xA44 | 0111100110110001111000011 |
| 0xA45 | 0111100110110001111000100 |
| 0xA46 | 0111100110110001111000101 |
| 0xA47 | 0111100110110001111000110 |
| 0xA48 | 0111100110110001111000111 |
| 0xA49 | 0111100110110001111001000 |

TABLE B-continued

| Token | Huffman Code |
|---|---|
| 0xA4A | 01111001101100011111001001 |
| 0xA4B | 01111001101100011111001010 |
| 0xA4C | 01111001101100011111001011 |
| 0xA4D | 01111001101100011111001100 |
| 0xA4E | 01111001101100011111001101 |
| 0xA4F | 01111001101100011111001110 |
| 0xA50 | 01111001101100011111001111 |
| 0xA51 | 01111001101100011111010000 |
| 0xA52 | 01111001101100011111010001 |
| 0xA53 | 01111001101100011111010010 |
| 0xA54 | 01111001101100011111010011 |
| 0xA55 | 01111001101100011111010100 |
| 0xA56 | 01111001101100011111010101 |
| 0xA57 | 01111001101100011111010110 |
| 0xA58 | 01111001101100011111010111 |
| 0xA59 | 01111001101100011111011000 |
| 0xA5A | 01111001101100011111011001 |
| 0xA5B | 01111001101100011111011010 |
| 0xA5C | 01111001101100011111011011 |
| 0xA5D | 01111001101100011111011100 |
| 0xA5E | 01111001101100011111011101 |
| 0xA5F | 01111001101100011111011110 |
| 0xA60 | 01111001101100011111011111 |
| 0xA61 | 01111001101100011111100000 |
| 0xA62 | 01111001101100011111100001 |
| 0xA63 | 01111001101100011111100010 |
| 0xA64 | 01111001101100011111100011 |
| 0xA65 | 01111001101100011111100100 |
| 0xA66 | 01111001101100011111100101 |
| 0xA67 | 01111001101100011111100110 |
| 0xA68 | 01111001101100011111100111 |
| 0xA69 | 01111001101100011111101000 |
| 0xA6A | 01111001101100011111101001 |
| 0xA6B | 01111001101100011111101010 |
| 0xA6C | 01111001101100011111101011 |
| 0xA6D | 01111001101100011111101100 |
| 0xA6E | 01111001101100011111101101 |
| 0xA6F | 01111001101100011111101110 |
| 0xA70 | 01111001101100011111101111 |
| 0xA71 | 01111001101100011111110000 |
| 0xA72 | 01111001101100011111110001 |
| 0xA73 | 01111001101100011111110010 |
| 0xA74 | 01111001101100011111110011 |
| 0xA75 | 01111001101100011111110100 |
| 0xA76 | 01111001101100011111110101 |
| 0xA77 | 01111001101100011111110110 |
| 0xA78 | 01111001101100011111110111 |
| 0xA79 | 01111001101100011111111000 |
| 0xA7A | 01111001101100011111111001 |
| 0xA7B | 01111001101100011111111010 |
| 0xA7C | 01111001101100011111111011 |
| 0xA7D | 01111001101100011111111100 |
| 0xA7E | 01111001101100011111111101 |
| 0xA7F | 01111001101100011111111110 |
| 0xA80 | 01111001101100011111111111 |
| 0xA81 | 10000101100100101000000000 |
| 0xA82 | 10000101100100101000000001 |
| 0xA83 | 10000101100100101000000010 |
| 0xA84 | 10000101100100101000000011 |
| 0xA85 | 10000101100100101000000100 |
| 0xA86 | 10000101100100101000000101 |
| 0xA87 | 10000101100100101000000110 |
| 0xA88 | 10000101100100101000000111 |
| 0xA89 | 10000101100100101000001000 |
| 0xA8A | 10000101100100101000001001 |
| 0xA8B | 10000101100100101000001010 |
| 0xA8C | 10000101100100101000001011 |
| 0xA8D | 10000101100100101000001100 |
| 0xA8E | 10000101100100101000001101 |
| 0xA8F | 10000101100100101000001110 |
| 0xA90 | 10000101100100101000001111 |
| 0xA91 | 10000101100100101000010000 |
| 0xA92 | 10000101100100101000010001 |
| 0xA93 | 10000101100100101000010010 |
| 0xA94 | 10000101100100101000010011 |
| 0xA95 | 10000101100100101000010100 |
| 0xA96 | 10000101100100101000010101 |
| 0xA97 | 10000101100100101000010110 |
| 0xA98 | 10000101100100101000010111 |
| 0xA99 | 10000101100100101000011000 |
| 0xA9A | 10000101100100101000011001 |
| 0xA9B | 10000101100100101000011010 |
| 0xA9C | 10000101100100101000011011 |
| 0xA9D | 10000101100100101000011100 |
| 0xA9E | 10000101100100101000011101 |
| 0xA9F | 10000101100100101000011110 |
| 0xAA0 | 10000101100100101000011111 |
| 0xAA1 | 10000101100100101000100000 |
| 0xAA2 | 10000101100100101000100001 |
| 0xAA3 | 10000101100100101000100010 |
| 0xAA4 | 10000101100100101000100011 |
| 0xAA5 | 10000101100100101000100100 |
| 0xAA6 | 10000101100100101000100101 |
| 0xAA7 | 10000101100100101000100110 |
| 0xAA8 | 10000101100100101000100111 |
| 0xAA9 | 10000101100100101000101000 |
| 0xAAA | 10000101100100101000101001 |
| 0xAAB | 10000101100100101000101010 |
| 0xAAC | 10000101100100101000101011 |
| 0xAAD | 10000101100100101000101100 |
| 0xAAE | 10000101100100101000101101 |
| 0xAAF | 10000101100100101000101110 |
| 0xAB0 | 10000101100100101000101111 |
| 0xAB1 | 10000101100100101000110000 |
| 0xAB2 | 10000101100100101000110001 |
| 0xAB3 | 10000101100100101000110010 |
| 0xAB4 | 10000101100100101000110011 |
| 0xAB5 | 10000101100100101000110100 |
| 0xAB6 | 10000101100100101000110101 |
| 0xAB7 | 10000101100100101000110110 |
| 0xAB8 | 10000101100100101000110111 |
| 0xAB9 | 10000101100100101000111000 |
| 0xABA | 10000101100100101000111001 |
| 0xABB | 10000101100100101000111010 |
| 0xABC | 10000101100100101000111011 |
| 0xABD | 10000101100100101000111100 |
| 0xABE | 10000101100100101000111101 |
| 0xABF | 10000101100100101000111110 |
| 0xAC0 | 10000101100100101000111111 |
| 0xAC1 | 10000101100100101001000000 |
| 0xAC2 | 10000101100100101001000001 |
| 0xAC3 | 10000101100100101001000010 |
| 0xAC4 | 10000101100100101001000011 |
| 0xAC5 | 10000101100100101001000100 |
| 0xAC6 | 10000101100100101001000101 |
| 0xAC7 | 10000101100100101001000110 |
| 0xAC8 | 10000101100100101001000111 |
| 0xAC9 | 10000101100100101001001000 |
| 0xACA | 10000101100100101001001001 |
| 0xACB | 10000101100100101001001010 |
| 0xACC | 10000101100100101001001011 |
| 0xACD | 10000101100100101001001100 |
| 0xACE | 10000101100100101001001101 |
| 0xACF | 10000101100100101001001110 |
| 0xAD0 | 10000101100100101001001111 |
| 0xAD1 | 10000101100100101001010000 |
| 0xAD2 | 10000101100100101001010001 |
| 0xAD3 | 10000101100100101001010010 |
| 0xAD4 | 10000101100100101001010011 |
| 0xAD5 | 10000101100100101001010100 |
| 0xAD6 | 10000101100100101001010101 |
| 0xAD7 | 10000101100100101001010110 |
| 0xAD8 | 10000101100100101001010111 |
| 0xAD9 | 10000101100100101001011000 |
| 0xADA | 10000101100100101001011001 |
| 0xADB | 10000101100100101001011010 |
| 0xADC | 10000101100100101001011011 |
| 0xADD | 10000101100100101001011100 |
| 0xADE | 10000101100100101001011101 |
| 0xADF | 10000101100100101001011110 |
| 0xAE0 | 10000101100100101001011111 |
| 0xAE1 | 10000101100100101001100000 |
| 0xAE2 | 10000101100100101001100001 |
| 0xAE3 | 10000101100100101001100010 |

TABLE B-continued

| Token | Huffman Code |
| --- | --- |
| 0xAE4 | 10000101100100101001100011 |
| 0xAE5 | 10000101100100101001100100 |
| 0xAE6 | 10000101100100101001100101 |
| 0xAE7 | 10000101100100101001100110 |
| 0xAE8 | 10000101100100101001100111 |
| 0xAE9 | 10000101100100101001101000 |
| 0xAEA | 10000101100100101001101001 |
| 0xAEB | 10000101100100101001101010 |
| 0xAEC | 10000101100100101001101011 |
| 0xAED | 10000101100100101001101100 |
| 0xAEE | 10000101100100101001101101 |
| 0xAEF | 10000101100100101001101110 |
| 0xAF0 | 10000101100100101001101111 |
| 0xAF1 | 10000101100100101001110000 |
| 0xAF2 | 10000101100100101001110001 |
| 0xAF3 | 10000101100100101001110010 |
| 0xAF4 | 10000101100100101001110011 |
| 0xAF5 | 10000101100100101001110100 |
| 0xAF6 | 10000101100100101001110101 |
| 0xAF7 | 10000101100100101001110110 |
| 0xAF8 | 10000101100100101001110111 |
| 0xAF9 | 10000101100100101001111000 |
| 0xAFA | 10000101100100101001111001 |
| 0xAFB | 10000101100100101001111010 |
| 0xAFC | 10000101100100101001111011 |
| 0xAFD | 10000101100100101001111100 |
| 0xAFE | 10000101100100101001111101 |
| 0xAFF | 10000101100100101001111110 |

What is claimed is:

1. A method in a computer system for improving data transmission of markup language documents, wherein the markup language documents include markup tags and information characters, the method comprising:
    parsing a document to recognize the markup tags;
    accessing a substantially markup-tag-specific table of tags, wherein the table lists the markup tags and assigns them tokens;
    converting the markup tags in the document to tokens which are adapted to be readily recognizable by a compression algorithm without the transmission of dictionary information;
    creating a token stream;
    compressing the token stream using said compression algorithm;
    decompressing the token stream using the compression algorithm; and
    recreating the markup tags from the token stream.

2. The method as recited in claim 1, wherein converting markup tags to tokens includes:
    parsing the document to recognize the tags;
    accessing a table of tags, wherein the table lists the tags and their associated tokens; and
    replacing the tags with the tokens.

3. The method as recited in claim 2, wherein parsing is performed by a recursive-descent parser.

4. The method as recited in claim 2, wherein the table of tags is extensible.

5. The method as recited in claim 1, wherein the markup tags are hypertext markup language tags.

6. The method as recited in claim 1, wherein the markup tags are extensible markup language tags.

7. The method as recited in claim 1, wherein the token stream includes the converted markup tags.

8. The method as recited in claim 1, wherein the token stream includes one or more information characters.

9. The method as recited in claim 8, wherein each of the information characters are tokens.

10. The method as recited in claim 1, wherein compressing the token stream includes encoding the token stream using Huffman coding.

11. The method as recited in claim 1, wherein compressing the token stream includes encoding the token stream using arithmetic coding.

12. The method as recited in claim 1, wherein compressing the token stream includes encoding the token stream using LZ77 coding.

13. The method as recited in claim 1, wherein compressing the token stream includes encoding the token stream using LZ78 coding.

14. The method as recited in claim 1, wherein compressing the token stream includes encoding the token stream using LZW coding.

15. The method as recited in claim 1, wherein converting the markup tags, creating a token stream and compressing the token stream are performed on a computer sending the markup language document.

16. The method as recited in claim 1, wherein converting the markup tags, creating a token stream and compressing the token stream are performed on a web browser.

17. The method as recited in claim 1, wherein converting the markup tags, creating a token stream and compressing the token stream are performed on a transmission network.

18. The method as recited in claim 1, wherein decompressing the token stream and recreating the markup tags are performed on a computer receiving the markup language document.

19. The method as recited in claim 1, wherein decompressing the token stream and recreating the markup tags are performed on a web browser.

20. The method as recited in claim 1, wherein decompressing the token stream and recreating the markup tags are performed on a transmission network.

21. A method in a computer system for improving data transmission of markup language documents, the method comprising:
    parsing the document to distinctly recognize a plurality of redundant markup tags;
    accessing a markup-specific table of tags, wherein the table lists the markup tags and a plurality of associated tokens;
    converting said markup tags into said tokens which are adapted to be readily recognizeable by a compression algorithm without the transmission of dictionary information; and
    creating a token stream using said compression algorithm.

22. The method as recited in claim 21, wherein parsing is performed by a recursive-descent parser.

23. The method as recited in claim 21, wherein the table of tags is extensible.

24. The method as recited in claim 21, wherein the markup tags are hypertext markup language tags.

25. The method as recited in claim 21, wherein the markup tags are extensible markup language tags.

26. The method as recited in claim 21, wherein the token stream includes the converted markup tags.

27. The method as recited in claim 21, wherein the token stream includes one or more information characters.

28. The method as recited in claim 27, wherein each of the information characters are tokens.

29. The method as recited in claim 21 further comprising compressing the token stream.

30. The method as recited in claim 29, wherein compressing the token stream includes encoding the token stream using Huffman coding.

31. The method as recited in claim 29, wherein compressing the token stream includes encoding the token stream using arithmetic coding.

32. The method as recited in claim 29, wherein compressing the token stream includes encoding the token stream using LZ77 coding.

33. The method as recited in claim 29, wherein compressing the token stream includes encoding the token stream using LZ78 coding.

34. The method as recited in claim 29, wherein compressing the token stream includes encoding the token stream using LZW coding.

35. The method as recited in claim 29, wherein converting the markup tags, creating a token stream and compressing the token stream are performed on a computer sending the markup language document.

36. The method as recited in claim 29, wherein converting the markup tags, creating a token stream and compressing the token stream are performed on a web browser.

37. The method as recited in claim 29, wherein converting the markup tags, creating a token stream and compressing the token stream are performed on a transmission network.

38. The method as recited in claim 29 further comprising decompressing the token stream.

39. The method as recited in claim 38, wherein decompressing the token stream is performed on a computer receiving the markup language document.

40. The method as recited in claim 38, wherein decompressing the token stream is performed on a web browser.

41. The method as recited in claim 38, wherein decompressing the token stream is performed on a transmission network.

* * * * *